US005383164A

United States Patent [19]
Sejnowski et al.

[11] Patent Number: 5,383,164
[45] Date of Patent: Jan. 17, 1995

[54] ADAPTIVE SYSTEM FOR BROADBAND MULTISIGNAL DISCRIMINATION IN A CHANNEL WITH REVERBERATION

[75] Inventors: Terrence Sejnowski, Solana Beach; Shao L. Li, San Diego, both of Calif.

[73] Assignee: The Salk Institute for Biological Studies, San Diego, Calif.

[21] Appl. No.: 74,940

[22] Filed: Jun. 10, 1993

[51] Int. Cl.$^6$ .............................................. G01S 13/68
[52] U.S. Cl. ................................ 67/134; 364/705.05; 455/33.1
[58] Field of Search ............... 367/901, 131, 132, 134, 367/124, 125, 126, 129; 340/850; 364/514, 705.05; 455/33.1; 367/123, 119; 342/147, 154, 157

[56] References Cited

U.S. PATENT DOCUMENTS 4,965,732  10/1990  Roy, III et al. ..................... 367/129

OTHER PUBLICATIONS

"Automatic Separation of Mixed Sound Sources by a Beamforming Herault-Jutten Network", Li et al., Proc. of the Annual Res. Sympos. Inst. for Neural Computation, U.S. San Diego, Jun. 12, 1992, pp. 67-69.
"Blind Separation of Sources, Part I: An Adaptive Algorithm Based On A Neuromimetic Architecture", Jutten et al., *Signal Processing* 24(1), pp. 1-10 (1991).
"Blind Separation of Sources, Part II: Problem Statement", Pierre Comon et al., *Signal Processing* 24(1), pp. 11-20 (1991).
"Blind Separation Sources, Part III: Stability Analysis", E. Sorouchyari, *Signal Processing* 24(1), pp. 21-29 (1991).
"Analog VLSI Implementation of An Auto-Adaptive Network for Real Time Separation of Independent Signals", Marc H. Cohen et al. *Advances in Neural Information Processing Systems*, vol. 4, Morgan-Kaufmann, San Mateo, Calif. (1992).
"Networks For The Separation of Sources That Are Superimposed and Delayed", Platt et al., Advances in NIPS, 1992, pp. 730-737.
"Design and Performance Analysis of a Digital Acoustic Telemetry System For The Short Range Underwater Channel", Catipovic et al., *IEEE*, 1984, pp. 242-252.
"A High Data Rate, Underwater Acoustic Data-Communications Transceiver", Jeffrey H. Fischer et al. *IEEE Oceans 92*, vol. 2, pp. 571-576, 1992.
"Adaptive Equalization Techniques For Acoustic Telemetry Channels", John G. Proakis, *IEEE Journal of Oceanic Engineering*, vol. 16, No. 1, pp. 21-31, Jan. 1991.

Primary Examiner—Daniel T. Pihulic
Attorney, Agent, or Firm—Baker, Maxham, Jester & Meador

[57] ABSTRACT

A system for separating mixed signal sources by processing a received signal through the combination of a beamforming network and an adaptive Hérault-Jutten network. The conventional Hérault-Jutten network is useful for separating independent signals that have been linearly mixed, but cannot separate a mixture of several independent signals in free field conditions because of the propagation time delays between sources and sensors. The system of this invention combines planar beamforming techniques with a conventional HJ network to adaptively distinguish among signals having delays introduced by the propagation medium. A new sensor filter scheme is introduced to eliminate beamforming variation with frequency over the band of interest. The resulting system has application to adaptive interferer rejection and to acoustic and cellular communications receivers.

27 Claims, 10 Drawing Sheets

ADAPTIVE SYSTEM FOR BROADBAND MULTISIGNAL DISCRIMINATION IN A CHANNEL WITH REVERBERATION

BACKGROUND OF THE INVENTION

1. Field of the Invention

This invention relates to systems for discriminating among multiple signals to recover information and, more specifically, to an adaptive system for recovering a signal from among several signal sources in a channel having reverberation.

2. Discussion of the Related Art

The separation of independent sources from an array of sensors is a classic but difficult problem in signal processing. Generally, the signal sources as well as their mixture characteristics are unknown. Without knowledge of the signal sources other than the general assumption of source independence, the signal processing problem is denominated "blind separation of sources". The separation is "blind" because nothing is known about the frequency or phase of the independent signals.

A concrete example of the blind separation of sources problem is where the pure (source) signals are sounds generated in a room and the mixed (sensor) signals are the outputs of several microphones (FIG. 1). Each of the pure signals is delayed and attenuated in some manner during transmission from source to microphone, where it is then mixed with other delayed and attenuated source signals. Multipath signals ("ghosts" created by reverberation) are delayed versions of the source signals arriving from different directions. This is denominated the "cocktail party" problem, where a person wishes to listen to a single sound source while filtering out other interfering sources including those created by reverberation.

Practitioners in the signal processing arts have pursued solutions to the blind source separation problem because of their broad application in many fields. For instance, in underwater acoustic digital communication, a receiver must eliminate multipath or reverberating versions of the transmitted signal to avoid unacceptable levels of intersymbol interference. The same multipath distortion problem is also well-known in the cellular telecommunications art.

Because the human ear automatically performs blind source separation, some practitioners have explored the neural network art for solutions to the blind separation of sources problem. For instance, Christian Jutten, et al ("Space or Time Adaptive Signal Processing By Neural Network Models", *Neural Networks for Computing, Snowbird, UI*, J. S. Denker, Ed., AIP Conference Proceedings 151, pp. 207-211, 1986) first introduced a simple neural network, herein denominated the Hérault-Jutten (HJ) network, with adaptive separation capability.

Since its introduction, the HJ network has been extensively studied by practitioners in the art. For a detailed discussion of the HJ network, reference is made to C. Jutten, et al, "Blind Separation of Sources, Part I: An Adaptive Algorithm Based On A Neuromimetic Architecture", *Signal Processing* 24(1), pp. 1-10 (1991). Jutten, et al show that their HJ network can provide an exact solution to the blind source separation problem provided that the signal mixtures are linear and that the number of independent sensors is at least equal to the number of sources. Unfortunately, it is not commonly possible to obtain N distinct linear combinations of N signals without delays or phase shifts. This is especially the case in channels with reverberation. To generate N full-rank linear combinations of inputs for the HJ network, microphones must be placed at N different locations for signal sources located at N different places (FIG. 1). The propagating medium between the N sources and the N sensors produces different weights on the different source signal arrivals at each sensor and introduces significant signal delays that cannot be accommodated by the conventional HJ network.

For a statistical explanation of the HJ network function and a discussion of a non-adaptive version of the HJ network, reference is made to Pierre Comon, et al "Blind Separation of Sources, Part II: Problem Statement", *Signal Processing* 24(1), pp. 11-20 (1991). Comon, et al observe that the HJ network actually functions by searching for common zeros of N functionals through pipelined stochastic iterations. They show that it relies on the assumed independence of sensor signals, which follows from the assumption of independent source signals only if the sensor signals are linear combinations of the source signals. They observe that any introduction of non-linearity changes the problem to one requiring solution of an overdetermined system of non-linear equations with several variables; a class of very difficult problems.

For a discussion of the stability of the HJ network, reference is made to E. Sorouchyari, "Blind Separation Sources, Part III: Stability Analysis", *Signal Processing* 24(1), pp. 21-29 (1991). Sorouchyari shows that using simple linear and cubic HJ network adaptation functions f(x) and g(x) offers convergence and stability that cannot be improved through the use of higher order non-linear adaptation functions.

For an extensive discussion of a monolithic circuit implementation of the HJ network and a review of HJ network operation, reference is made to Marc H. Cohen, et al, "Analog VLSI Implementation of An Auto-Adaptive Network for Real Time Separation of Independent Signals", *Advances in Neural Information Processing Systems*, Vol. 4, Morgan-Kaufmann, San Mateo, Calif. (1992).

Because of the difficulty of ensuring linear combinations of source signals at the sensor outputs, the problem of separating non-linear signal combinations is of great interest. For instance, John G. Proakis ("Adaptive Equalization Techniques For Acoustic Telemetry Channels", *IEEE Journal of Oceanic Engineering*, Vol. 16, No. 1, pp. 21-31, Jan. 1991) provides a tutorial review of adaptive equalization techniques for reducing intersymbol interference in high-speed digital communications over time-dispersive channels. Also, Jeffrey H. Fischer, et al ("A High Data Rate, Underwater Acoustic Data-Communications Transceiver", *IEEE Oceans 92*, Vol. 2, pp. 571-576, 1992) describe an underwater high-speed data communications transceiver that features direct-sequence spread-spectrum encoding to mitigate intersymbol interference arising from reverberation in shallow acoustic channels. Neither Proakis nor Fischer, et al propose multichannel blind separation as a model for reducing intersymbol interference. Both practitioners rely on frequency redundancy in the signals; the classical adaptive techniques they advocate either treat multipath signals as noise or rely on embedded training signals and enormous computational complexity. Except for the nonlinearity rising from time delays over the source-to-sensor path, the HJ network offers a superior and simpler solution to the intersymbol interference problem.

Accordingly, John C. Platt, et al ("Networks For The Separation of Sources That Are Superimposed and Delayed", *Advances in Neural Information Processing Systems*, Vol. 4, Morgan-Kaufmann, San Mateo, Calif., 1992) have proposed extending the HJ network to also estimate a matrix of time delays while estimating the HJ network mixing matrix. Platt, et al have proposed a new network to separate signals that are mixed either with time delays or through filtering. They show that the Hérault-Jutten learning rules fulfill a minimum output power principle, which they then apply to their extension. However, Platt, et al also note that their learning technique has multiple stable states and they cannot predict convergence to a solution except through experimentation.

Accordingly, a reliable and useful method for coping with unknown delays in the blind separation of sources problem is a clearly-felt need in the art. The related unresolved problems and deficiencies are clearly felt in the art and are solved by this invention in the manner described below.

SUMMARY OF THE INVENTION

The system of this invention adds directionality to the sensor response as a technique for coping with unknown source signal delays at the sensor. A linear array of sensors is used to produce N fixed beam lobes without phase shifts. Reverberation is thereby reduced (spatially filtered) so that multipath signals may be treated as independent sources.

This is the equivalent of having N virtual directional sensors at a single spatial location, with each oriented to a different direction. If N signal sources are located such that each lies in a different direction from the $M \geq N$ collocated sensors, then M full-rank linear combinations of N signals are formed as required for the HJ network. Each sensor output may be filtered to equalize for variations in beamlobe response over a predetermined frequency range.

It is an object of this invention to extend the HJ network to compensate for nonlinearity in source signal combinations arising from source signal propagation delays at the sensor. It is an advantage of the system of this invention that adding linear array beamforming processing to the HJ network eliminates intersymbol interference arising from unknown source signal time delays.

It is another object of this invention to adaptively separate signals that are unknown in location, frequency and time delay. It is an advantage of this invention that HJ network adaptation procedure readily converges to a stable solution to the blind separation of source problem once the propagation medium time delays are removed through beamformer processing.

It is yet another advantage of the system of this invention that there is no performance penalty for long impulse responses caused by long propagation delays. It is a further advantage of the system of this invention that no training signals are needed for equalization because the HJ network is self-training.

The foregoing, together with other objects, features and advantages of our invention, will become more apparent when referring to the following specification, claims and the accompanying drawing.

BRIEF DESCRIPTION OF THE DRAWINGS

For a more complete understanding of our invention, we now refer to the following detailed description of the embodiments as illustrated in the accompanying drawing, wherein:

FIG. 2 comprising

FIG. 6, comprising

DETAILED DESCRIPTION OF THE PREFERRED EMBODIMENTS

The Blind Separation of Sources Problem

Figure 1:
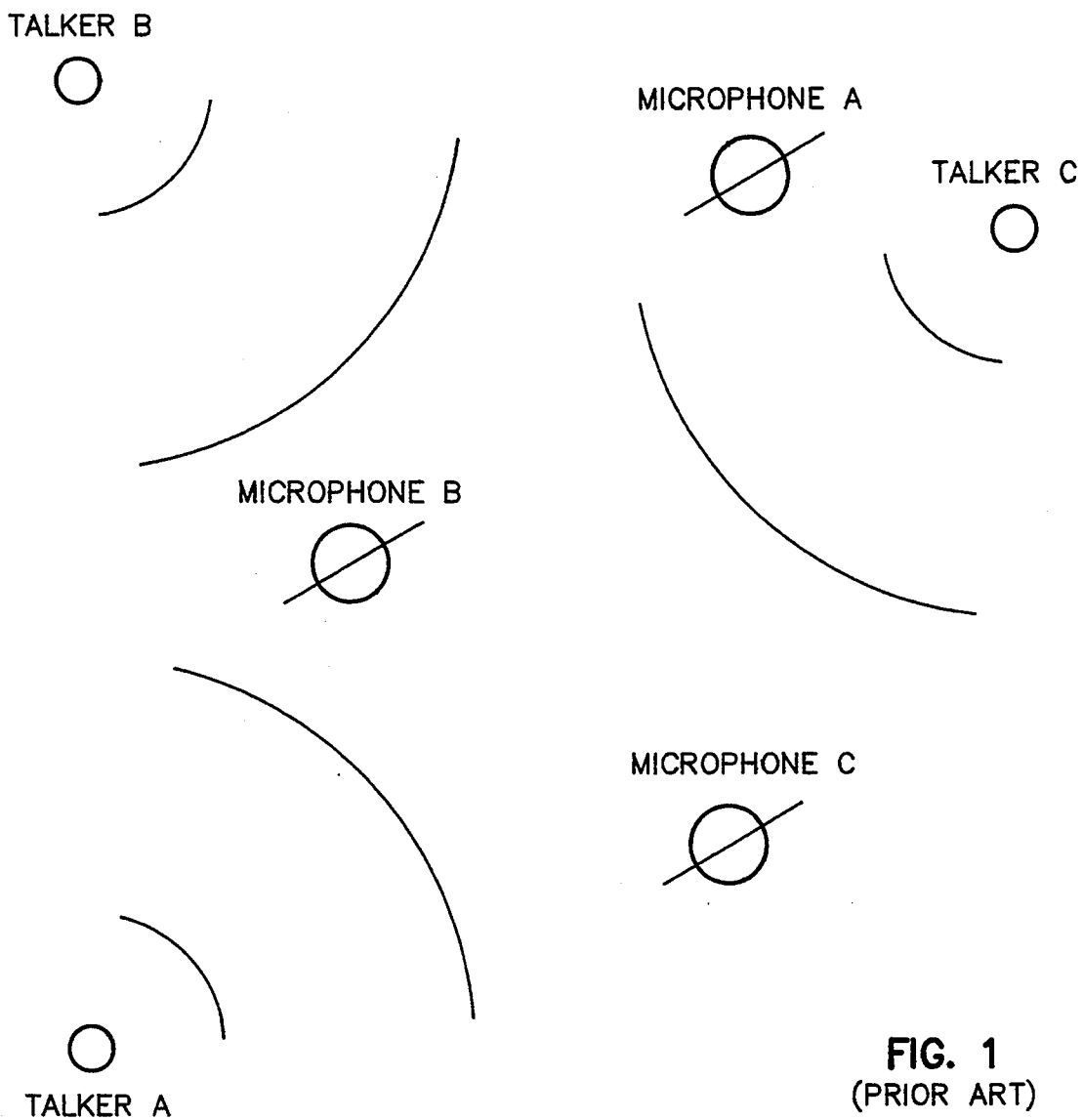
FIG. 1 illustrates the blind separation of sources problem from the prior art.

FIG. 1 shows an exemplary arrangement for the blind separation of signal sources problem. Three independent Talkers are generating three independent source signals. Three Microphones are positioned in three different locations. Each Microphone produces a single electrical output signal (not shown) corresponding to a linear combination of the three signals from the Talkers. These three microphone signals are independent because the three Microphones are located independently. Unfortunately, at each Microphone, each Talker signal has a different time delay with respect to its actual source signal. For instance, the signal from Talker B at Microphone B has a different propagation delay than the signal from Talker B at Microphone C. Since these delay differences are unknown in the "blind" separation problem, the simple additive model of interference assumed by the Hérault-Jutten (HJ) network is then not adequate to recover the original source signals.

Figure 2A:
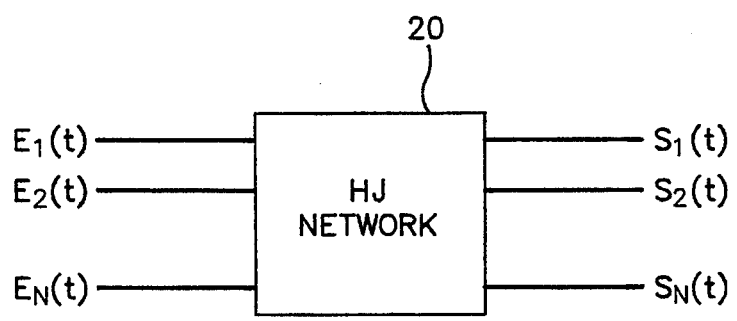
FIGS. 2A-2D, shows several embodiments of the Hérault-Jutten network from the prior art.
Figure 2B:
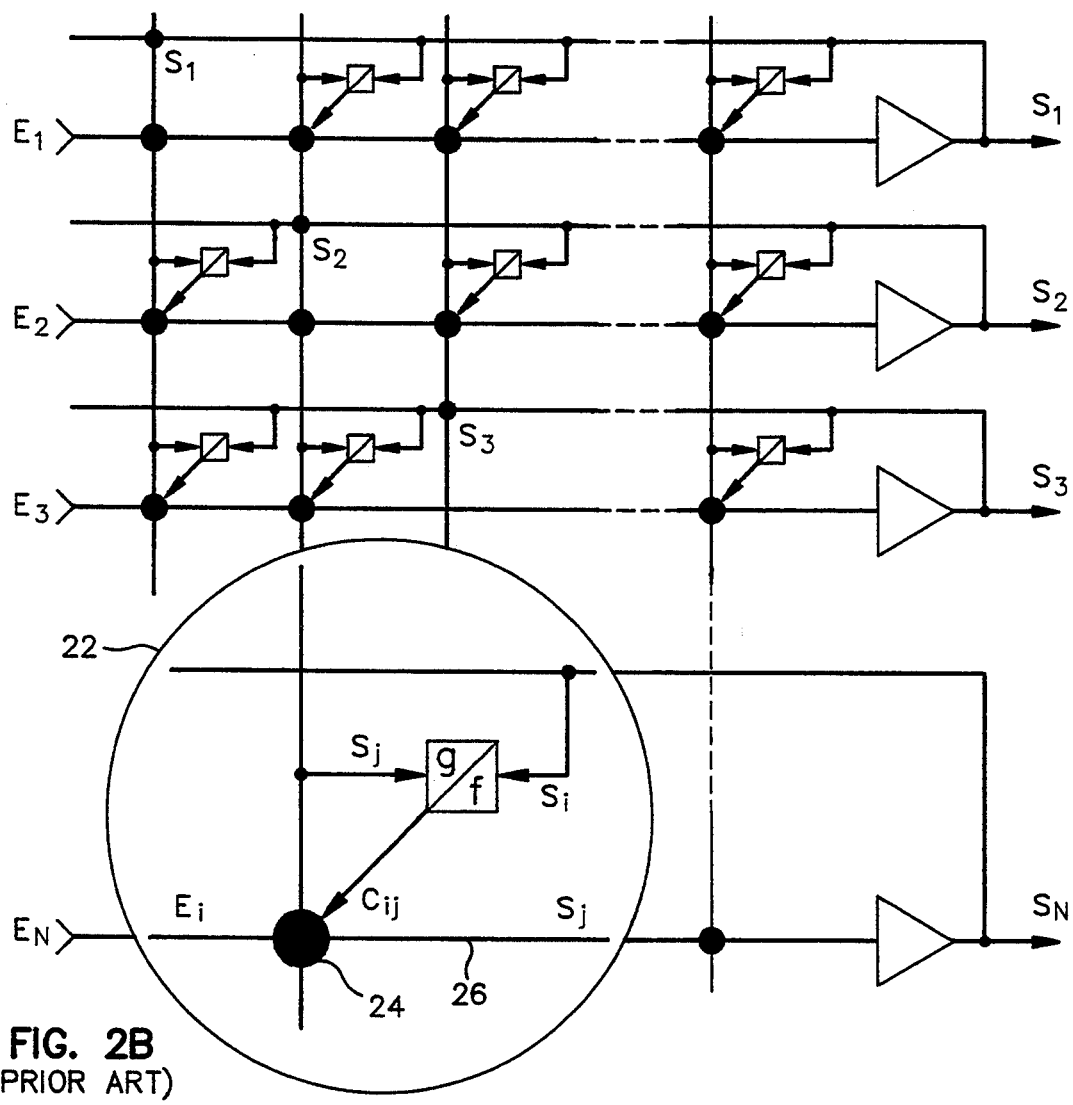
Figure 2C:
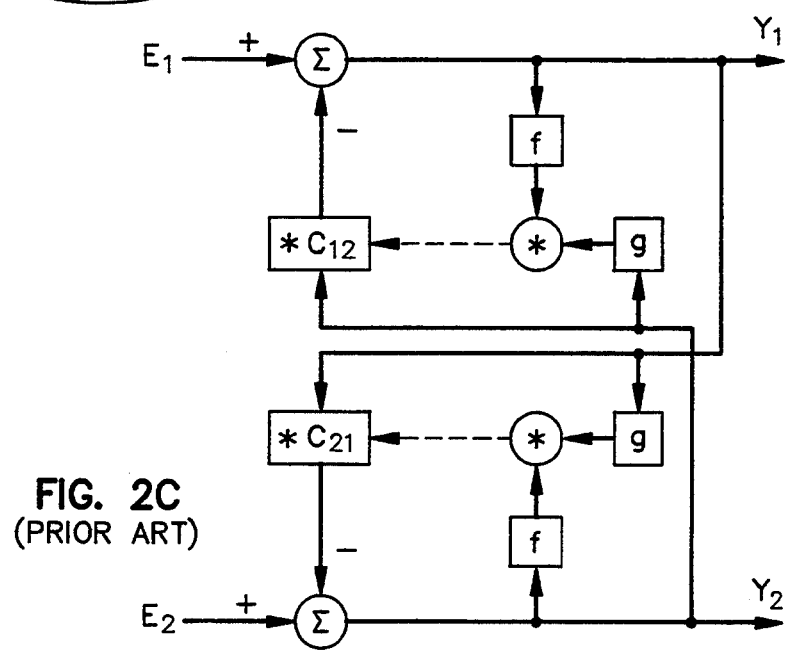
Figure 2D:
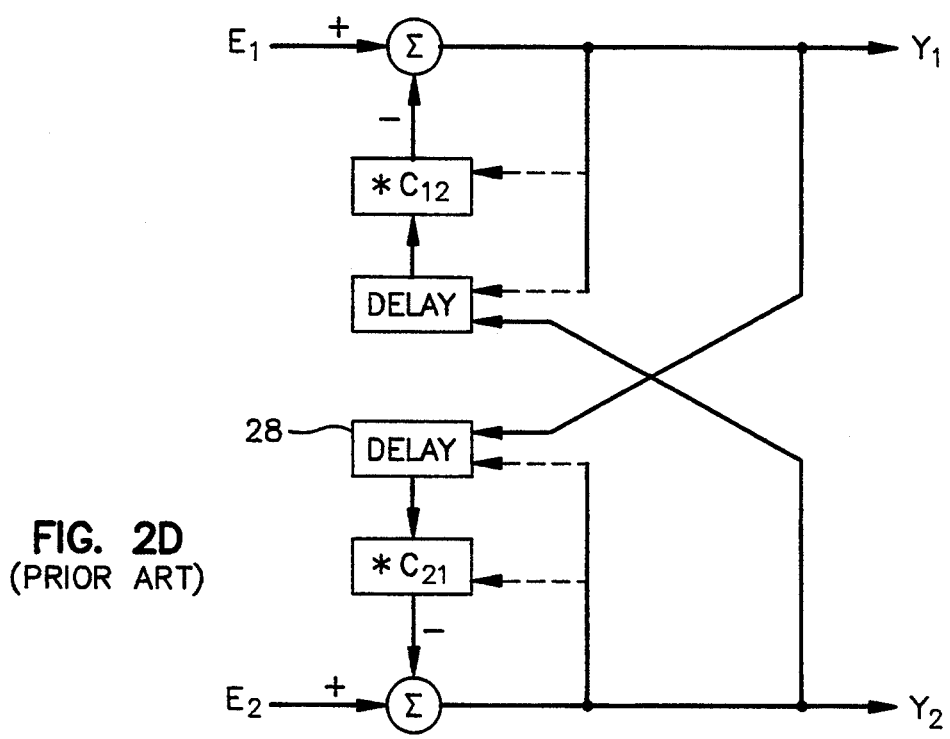

FIG. 2A shows a functional representation of a $N \times N$ HJ network 20 from the prior art. FIG. 2B shows a detailed functional diagram of the $N \times N$ HJ network of FIG. 2A. FIG. 2C shows a simple functional diagram of a $2 \times 2$ HJ network from the prior art. FIG. 2D shows an extended version of the $2 \times 2$ HJ network of FIG. 2C first proposed by Platt, et al in the above-cited reference for application to the blind source separation problem with delays (FIG. 1).

HJ network 20 is an N by N network that can be used to solve a signal processing problem described as follows: Given N observed data sequences that are distinct linear combinations (full rank) of N physical independent signals without time delays or phase shifts, network 20 can adaptively recover the N physical signals without prior knowledge of the linear mixing matrix relating the two groups of signals. This is expressed in mathematical form as:

$$\begin{bmatrix} E_1(t) \\ E_2(t) \\ \cdot \\ \cdot \\ \cdot \\ E_N(t) \end{bmatrix} = \begin{bmatrix} a_{11} & a_{12} & \cdots & a_{1N} \\ a_{21} & a_{22} & \cdots & a_{2N} \\ \cdot & \cdot & & \cdot \\ \cdot & \cdot & & \cdot \\ \cdot & \cdot & & \cdot \\ a_{N1} & a_{N2} & \cdots & a_{NN} \end{bmatrix} \begin{bmatrix} S_1(t) \\ S_2(t) \\ \cdot \\ \cdot \\ \cdot \\ S_N(t) \end{bmatrix} \quad \text{[Eqn. 1]}$$

where $\{E_i(t)\}$ are the known observed data, $[A_{ij}]$ is an unknown full rank matrix and $\{S_j(t)\}$ are the original source signals to be recovered. HJ network 20 is a memoryless system, as may be appreciated by examining Eqn. 1. Thus, at any given time $t=t_1$, the output $[E_i(t_1)]$ depends only on $[S_j(t_1)]$ and not on any other past or future values of $[S_j(t_1)]$. Note also that $E_i(t)$ is a linear combination of $\{S_1(t), \ldots, S_N(t)\}$, which are presumed independent of one another, and the mixing matrix $[A_{ij}]$ is nonsingular. Herein, $\{E_i\}$ denominates an unordered set of elements $E_i$, and $[E_i]$ denominates an ordered vector of elements, $E_i$.

HJ network 20 functions by defining a transform matrix $[C_{ij}]$ as follows:

$$[C_{ij}] = \begin{bmatrix} 0 & \cdots & \cdot & C_{ij} \\ \cdot & \cdot & & \cdot \\ \cdot & \cdot & & \cdot \\ \cdot & \cdot & & \cdot \\ C_{ij} & \cdots & \cdot & 0 \end{bmatrix} \quad \text{[Eqn. 2]}$$

The outputs of HJ network 20 are the estimated source signals, $\{Y_j(t)\}$, which are equal to $\{S_j(t)\}$ when the transform matrix coefficients stabilize at a solution to the blind source separation problem. This estimation can be written as:

$$\begin{bmatrix} Y_1(t) \\ Y_2(t) \\ \cdot \\ \cdot \\ \cdot \\ Y_N(t) \end{bmatrix} = [II + C]^{-1} \begin{bmatrix} E_1(t) \\ E_2(t) \\ \cdot \\ \cdot \\ \cdot \\ E_N(t) \end{bmatrix} \quad \text{[Eqn. 3]}$$

where [II] is the identity matrix having "zero" off-diagonal terms and "unity" diagonal terms. The transform matrix elements $\{c_{ji}\}$ are adjusted over time in accordance with an adaptive rule expressed as:

$$\frac{dc_{ij}}{dt} = \mu f(E_i) g(E_j) \quad \text{[Eqn. 4]}$$

where f(E) and g(E) are different odd functions selected according to a Heppian learning rule to provide rapid convergence to a solution. These are odd adaptation functions because they must preserve the assumed zero mean condition and their product must constitute a test for independence. Several practitioners have suggested making $f(E)=E^3$ and $g(E)=E$. The value of $\mu$ sets the speed of adaptation over time. When the HJ network learning approaches an equilibrium point, $Y_j(t)$ approaches $S_j(t)$. At the solution point, $[II+C]$ is equal to the mixing matrix [A] multiplied by some diagonal gain matrix and some permutation matrix. Thus, after convergence, each output of HJ network 20 is proportional to (or equal to) only one initial source signal.

FIG. 2B shows a detailed functional embodiment of HJ network 20 from FIG. 2A. An exemplary transform estimator element 22 is shown in the inset area. The $i^{th}$ estimated source signal $S_i$ is fed back as the kernel of the adaptor function f(x). Similarly, the $j^{th}$ estimated source signal $S_j$ is also fed back through the network as the kernel the second adaptor function g(x). The product of these two adaptation functions is then weighted and subtracted from the stored value of the appropriate element $c_{ij}$ (Eqn. 4). The transform element $c_{ij}$ is presented to a multiplier 24 where it is multiplied by the $j^{th}$ input signal $E_i$. The resulting product is then added to the bus 26, where it is summed into a new value of the $j^{th}$ output signal $S_j$. This process can be appreciated with reference to Eqns. 3–4 and the above-cited Cohen, et al reference.

FIG. 2C shows a 2×2 HJ network representation, where the dashed arrows represent adaptation. In similar format, FIG. 2D shows another embodiment of the HJ network adapted to separate signals mixed with single delays. The dashed arrows represent adaptation and the source of the arrow is the source of the error used by gradient descent. The adjustable delay 28 avoids the degeneracy in the learning rule arising when attempting to solve the blind source separation problem shown in FIG. 1. This network can handle some simple delayed interference problems, while the HJ networks of FIG. 2B–2C cannot. The performance of this extended HJ network can be understood with reference to the above-cited Platt, et al paper.

An Adaptive Network Extension Using Directional Separation

Figure 3:
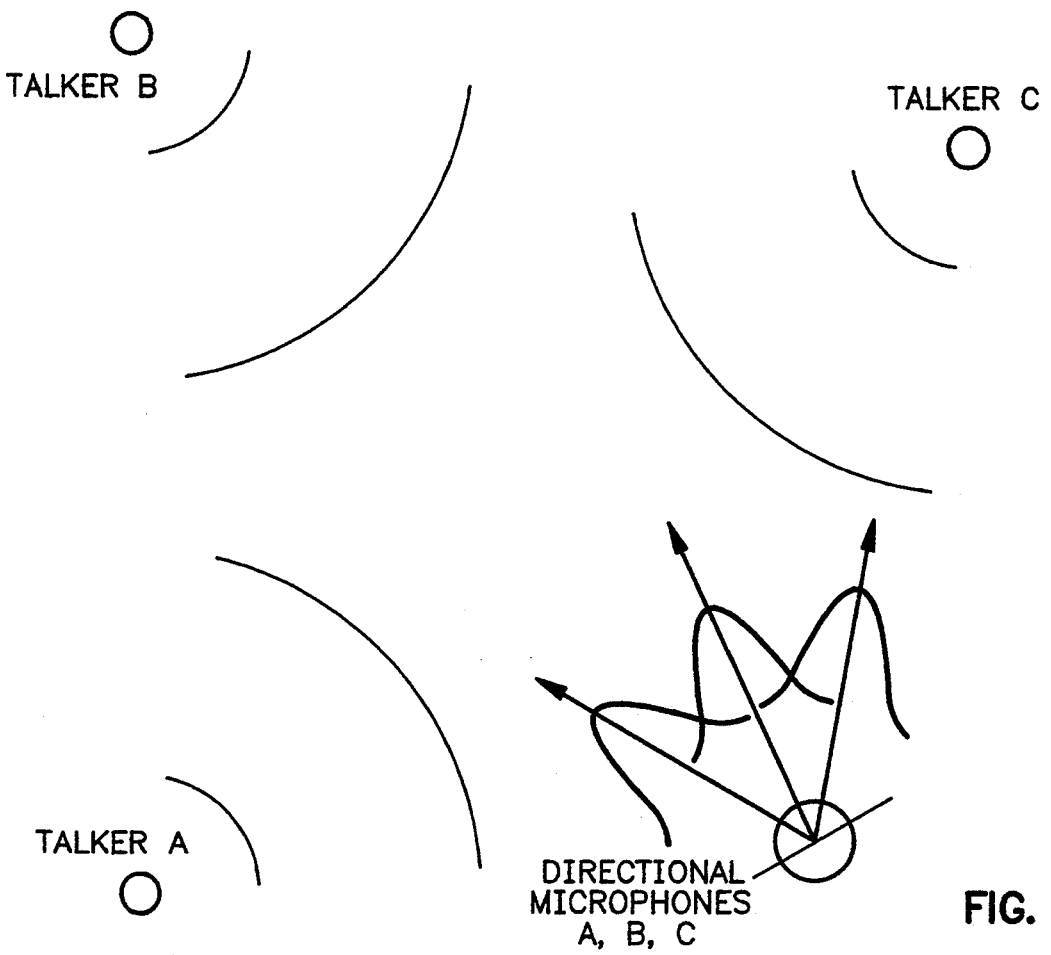
FIG. 3 shows the problem of FIG. 1 recast in accordance with the system of this invention.

The system of this invention redefines the blind source separation problem of FIG. 1 and casts it as shown in FIG. 3. The same three Talkers are positioned as in FIG. 1 but the three Microphones are shown collocated with directionality rather than distributed as in FIG. 1. Normally three collocated Microphones cannot provide three independent linear combinations of the signals from Talkers A–C. However, the system of this invention introduces a beamformer to form multiple beamlobes using the three microphone outputs. These multiple beams represent independent signals that are propagated from different directions. Each such spatial beam output signal is a distinct linear combination of $S_i(t)$, as is required by the HJ network represented in Eqn. 1.

Because HJ network 20 cannot remove time delays or phase distortions, the beamformer of this invention must not introduce phase changes in the received signals. Moreover, this "zero phase" requirement must be satisfied over the entire operating frequency range of interest. That is, the beamformer of this invention must process each $S_i(t)$ over a predetermined frequency range of interest without variation in signal phase shift. This beamformer is now described below.

Figure 4:
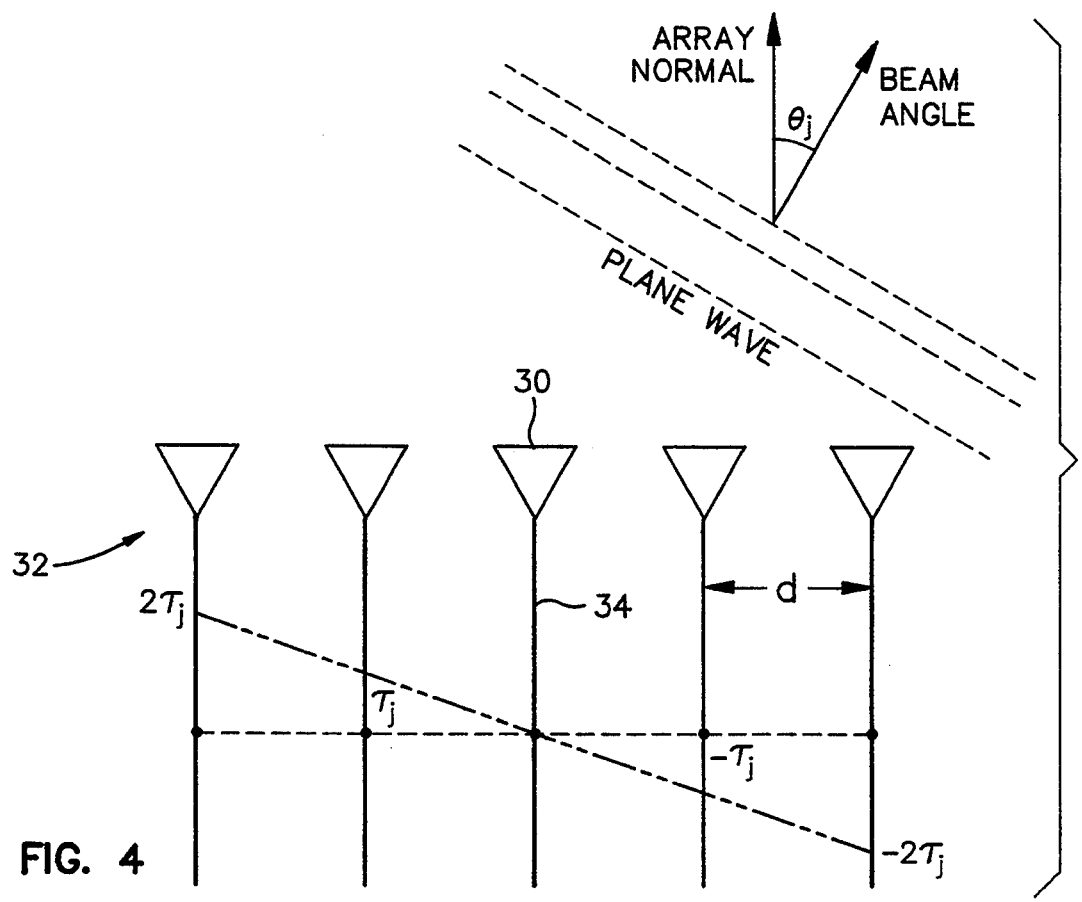
FIG. 4 shows a linear sensor array from the prior art.
Figure 5:
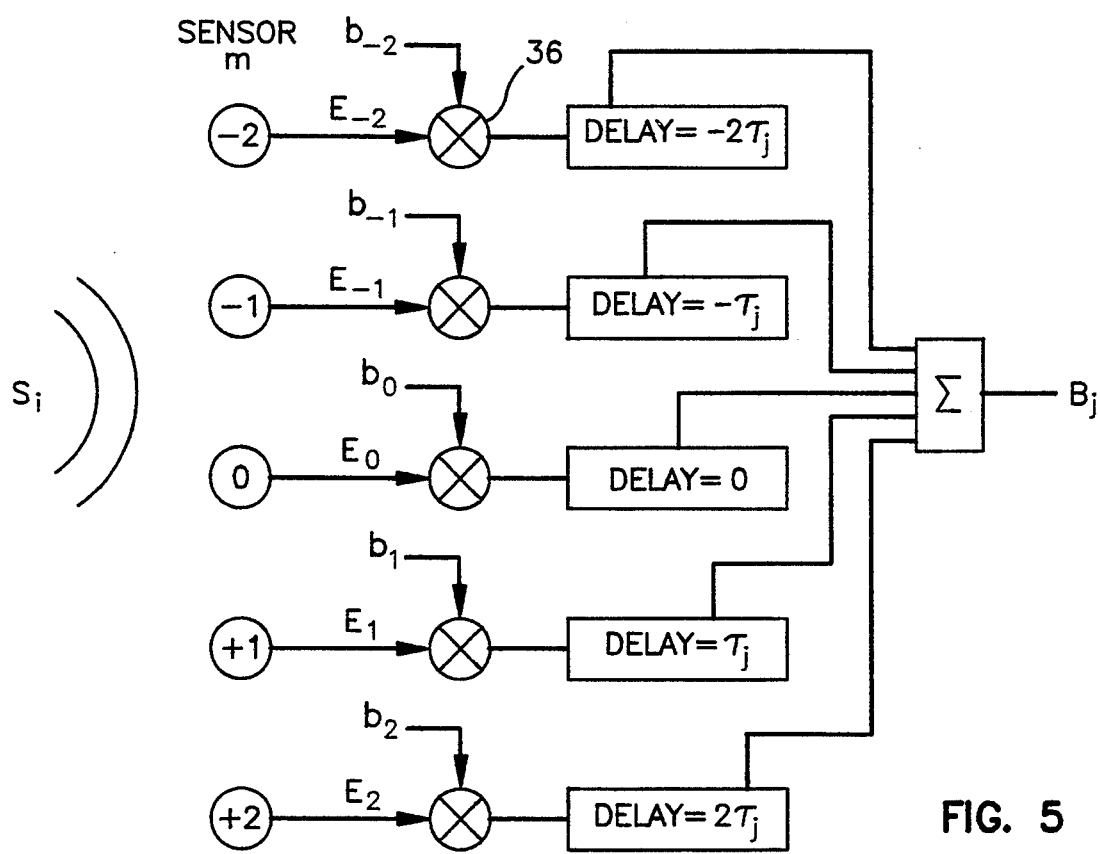
FIG. 5 shows an illustrative embodiment of the linear sensor array beamforming network used in this invention.

Referring to FIG. 4, a row of sensors, exemplified by sensor 30, are uniformly spaced at distance d to form a sensor array 32. Because the number of sensors is equal to $2M+1$, where M is an integer, sensor array 32 is symmetrical about the center element 30. If the signal 34 from center element 30 is defined as $E_0(t)$, a spatial beam signal $B_j(t)$ is formed by adding time delays $\tau_j$ to the output of each sensor and adding them up such that:

$$B_j(t) = \sum_{m=-M}^{+M} b_m E_m(t - m\tau_j) \quad \text{[Eqn. 5]}$$

where $B_j(t)$ is the $j^{th}$ spatial beam signal oriented at angle $\theta_j$ with respect to the array normal, $E_m(t)$ is the output of the $m^{th}$ sensor counting from center element 30, and $b_m$ is the $m^{th}$ shading multiplier used in forming the beam, exemplified by multiplier 36 in FIG. 5. The relationship between the signal time delay $\tau_j$ and the spatial beam stearing angle $\theta_j$ is:

$$\tau_j = \frac{d}{c} \sin\theta_j \quad \text{[Eqn. 6]}$$

where $\theta_j$ is the main beamlobe angle with respect to the array normal as shown in FIG. 4. FIG. 5 provides a functional block diagram of the beamformer for the array of FIG. 4.

Assuming that a plane-wave source signal $S_i(t)$ is arriving from an angle $\theta_i$ (FIG. 4), the output of the $m^{th}$ sensor is:

$$E_m(t) = \eta_m S_i(t - m\tau_i) \quad (7)$$

where $\eta_m$ is a scalar transducer gain for the $m^{th}$ sensor and $\tau_j$ (see Eqn. 6) is the time delay between neighboring sensors arising from the finite wave propagation velocity c in the medium along the path from the direction of the $i^{th}$ Source signal $S_i(t)$. If Eqn. 7 is substituted into Eqn. 5, the resulting relationship:

$$B_j(t) = \sum_{m=-M}^{+M} b_m \eta_m S_i[t - m(\tau_j - \tau_i)] \quad \text{[Eqn. 8]}$$

shows the fraction of source signal $S_i$ that is received in the $j^{th}$ spatial beam signal $B_j(t)$.

Eqn. 8 shows that the beam direction can be steered by changing $\tau_j$. If the sensor weights $b_m$ and $\eta_m$ are symmetric with respect to center sensor signal 34, then $b_m = b_{-m}$ and $\eta_m = \eta_{-m}$. If $b_0 \eta_0 = 1$, then the Fourier transform of Eqn. 8 is:

$$B_j(\omega) = S_i(\omega) \sum_{m=-M}^{+M} b_m \eta_m e^{-im\omega(\tau_j - \tau_i)} \quad \text{[Eqn. 9]}$$

$$= S_i(\omega) \left[ 1 + 2 \sum_{m=1}^{M} b_m \eta_m \cos[m\omega(\tau_j - \tau_i)] \right]$$

$$B_j(\omega) = S_i(\omega) a_{ij}(\omega)$$

Because $a_{ij}(\omega)$ in Eqn. 9 has no imaginary component, there are no phase shifts or delays introduced in $B_j(\omega)$ for any values of $\omega$, $\tau_j$ or $\tau_i$. Thus, the symmetry of the sensor array 32 with respect to central sensor signal 34 eliminates the phase shifts between the several spatial beam outputs $B_j$. If exact delay lines are used to form the beam, the phase shifts of the $-m^{th}$ and $+m^{th}$ sensor outputs must cancel exactly.

For narrow-band signals centered at $\omega_0$, $\{a_{ij}(\omega_0)\}$ from Eqn. 9 can be considered to be substantially constant over the narrow bandwidth. For I incoming signals from different angles $\theta_j$, one may form $N \geq I$ separate beams by selecting N sets of delays $\tau_j$ for N different but fixed directions. These beam signals represent N linear combinations of the I narrow-band source signals without delays and these combinations may then usefully serve as inputs to an adaptive network such as a HJ network. This arrangement is equivalent to having N virtual directional microphones at single location at central sensor 30, each aimed in a different direction. If all original narrow-band source signals are located in different directions, N full-rank linear combinations of I signals are formed as required for the HJ network. In the time domain, Eqn. 9 has the same form as Eqn. 1, where $\{a_{ij}(\omega_0)\}$ are the elements of the mixing matrix $[A_{ij}]$.

A conventional HJ network (FIG. 2A) uses amplitude differences to form the different elements $\{c_{ij}\}$ of the transform matrix $[C_{ij}]$. The system of this invention relies on differences in spatial beam signal magnitudes representing linear combinations of signals arriving from different directions. Passing $I \leq N$ of the N beamformer outputs $\{B_j(t)\}$ through an I by I HJ network recovers the I original signals $\{S_i(t)\}$ when the HJ network stabilizes at an equilibrium.

Obtaining Broadband Distortion-Free Spatial Beam Signals

The separation of multiple broadband signal sources is not feasible with the beamformer described above in connection with FIG. 5 because the directional sensitivity of sensor array 32 varies with operating frequency. In such case, each $a_{ij}(\omega)$ in Eqn. 9 varies with frequency and Eqn. 9 is no longer equivalent to Eqn. 1 for broadband signals. However, the system of this invention corrects this problem by adding a filter element to each of the weighting multipliers exemplified by multiplier 36 in FIG. 5. With this approach, it should be possible to construct a beamformer whose beamlobe width is frequency-invariant over a predetermined frequency bandwidth. Substituting the necessary filter characteristic $h_m(t)$ for the $m^{th}$ sensor element in Eqn. 8 yields:

$$B_j(t) = \sum_{m=-M}^{+M} \eta_m h_m(t) * S_i[t - m(\tau_j - \tau_i)] \quad \text{[Eqn. 10]}$$

where * indicates convolution. In the frequency domain, Eqn. 10 adopts the form:

$$B_j(\omega) = S_i(\omega)\left[1 + 2\sum_{m=1}^{M} \eta_m H_m(\omega)\cos[m\omega(\tau_j - \tau_i)]\right] \quad \text{[Eqn. 11]}$$

where the array symmetry assumption is extended to $H_m(\omega) = H_{-m}(\omega)$ and the expression in brackets is real as in Eqn. 9.

Figure 6A:
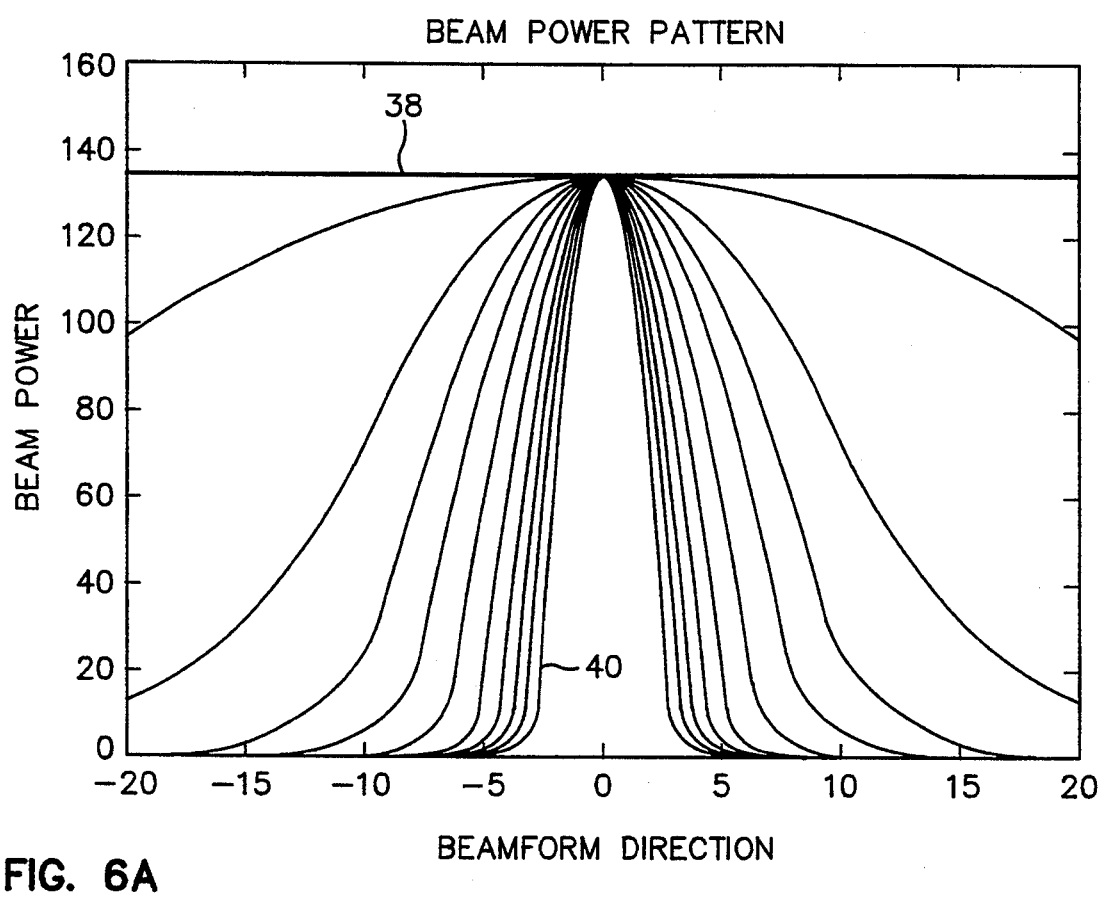
FIGS. 6A and 6B, shows array beam power versus operating frequency with simple Gaussian shading for sensor compensation.
Figure 6B:
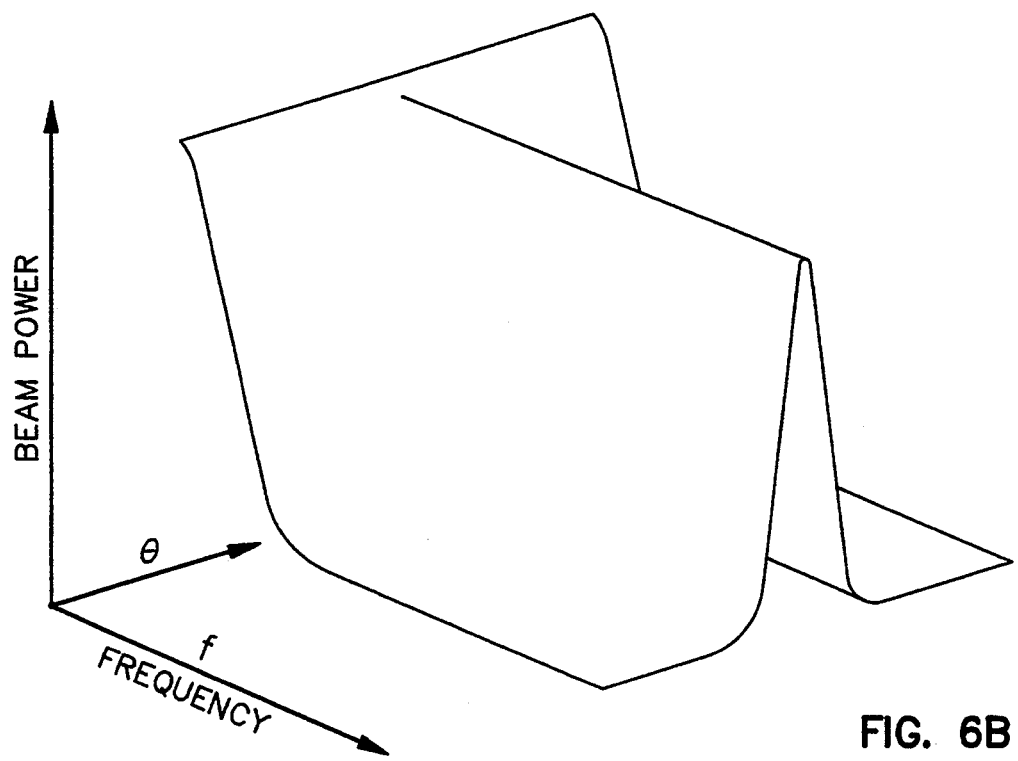
Figure 8:
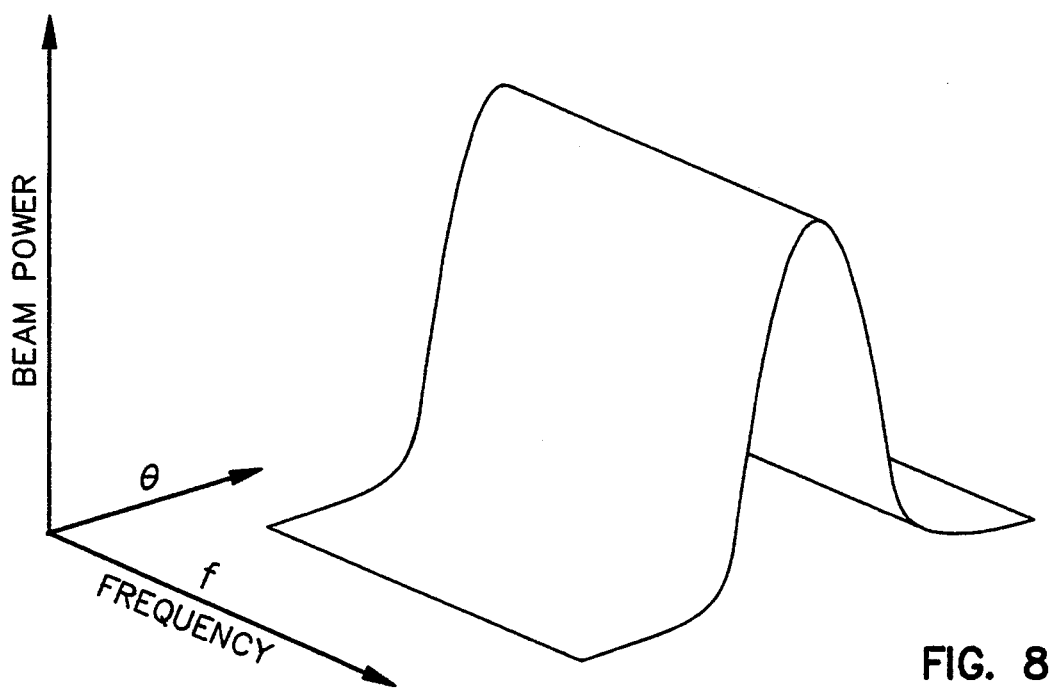
FIG. 8 shows array beam power versus operating frequency with the sensor frequency compensation of this invention.

FIG. 6A shows the family of curves representing the mainlobe beam pattern from "zero frequency" (curve 38) to 8 kHz (curve 40) for an exemplary 25-element array (not shown) with Gaussian-window shading at a single-frequency $\omega_o$ according to Eqn. 12 below. FIG. 6B shows the same information displayed in three dimensions to better illustrate the beam-narrowing effect of increased operating frequency. Frequency dependence of transducer constants and related effects are ignored in this illustration. The system of this invention adds filters $\{H_m\}$ to the individual sensor elements as necessary to cancel the beamlobe frequency-dependence shown in FIG. 6B, thereby obtaining the frequency-invariant beam pattern exemplified by the three-dimensional illustration in FIG. 8. Selecting the filter characteristics necessary to perform this array equalization function should result in complete cancellation of time and phase delays in the sensor array beam signals $\{B_j\}$ over a predetermined operating frequency range. The beam signal characteristic shown in FIG. 8 provides the linear combination of source signals necessary for proper convergence of the HJ network (FIGS. 2A–C).

The filter transfer functions $\{H_m(\omega)\}$ should be selected so that $\{B_j(\omega)\}$ (Eqn. 11) are independent of $\omega$ over the predetermined signal bandwidth interval ($\omega_a \leq \omega_b$). There are many useful ways to parameterize $H_m(\omega)$. The method of this invention preferred for achieving this objective is now described.

First, a frequency $\omega_0$ is chosen such that $\omega_a \leq \omega_0 \leq \omega_b$. At frequency $\omega_0$, the outputs of the sensors are weighted by a Gaussian window function to reduce sidelobes. This function is written:

$$b_m = H_m(\omega_0) = e^{-\frac{m^2}{\alpha_0}} \quad \text{[Eqn. 12]}$$

At frequencies immediately adjacent $\omega_0$, the following cost function is minimized at each frequency $\omega$ over a range of steering directions represented by time delays from $\tau=0$ to $\tau=\tau_0$:

$$[\alpha(\omega), \delta(\omega), \gamma(\omega)] = \quad \text{[Eqn. 13]}$$

$$\arg\min_{\alpha,\delta,\gamma} \int_0^{\tau_0}\left[\sum_{m=1}^{M} e^{-\frac{m^2}{\alpha_0}}\cos(m\omega_0\tau) - (\gamma e^{-\frac{m^2}{\alpha}} + \delta)\cos(m\omega\tau)\right]^2 d\tau,$$

Next, the transfer function $H_m(\omega)$ of the filter for the $m^{th}$ sensor is found:

$$H_m(\omega) = \gamma(\omega)\, e^{\frac{-m^2}{\alpha(\omega)}} + \delta(\omega) \quad \text{[Eqn. 14]}$$

Figure 9:
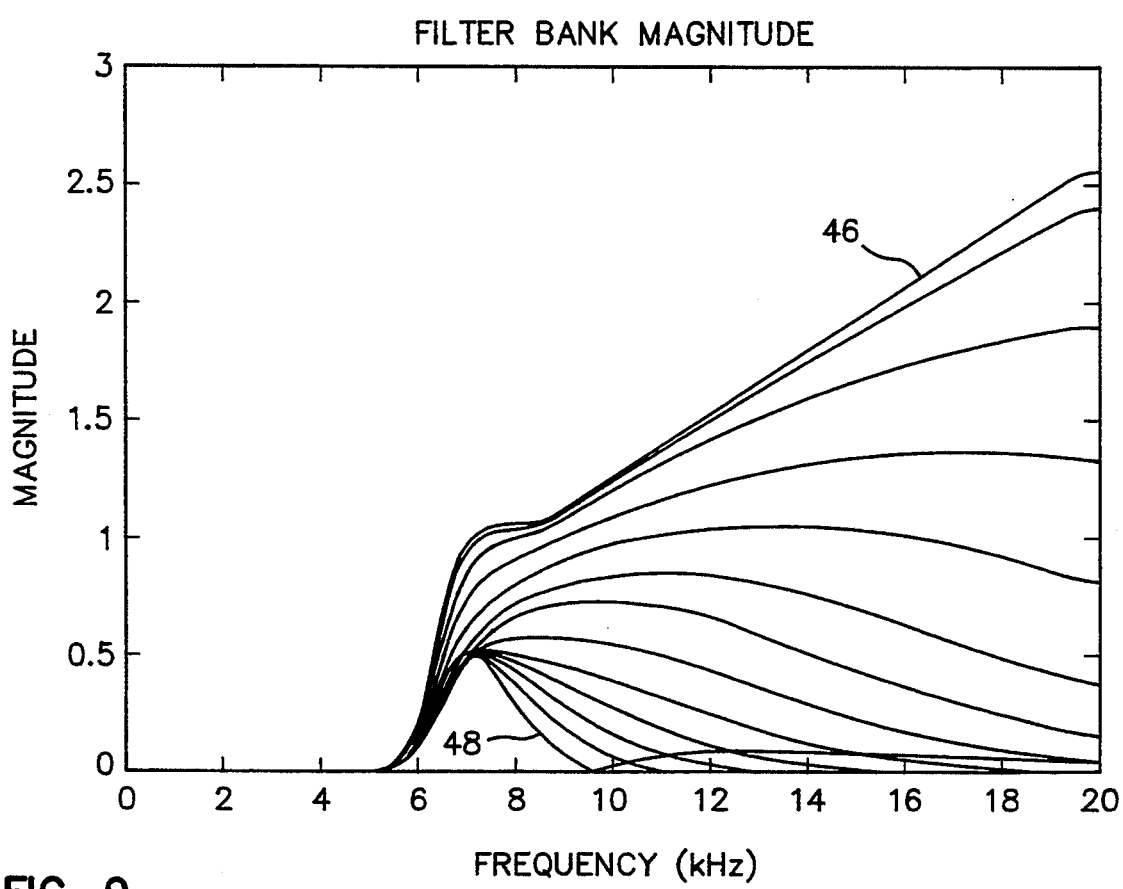
FIG. 9 shows gain amplitude versus operating frequency for the plurality of sensor compensation filters of this invention required in an illustrative linear sensor array.
Figure 10:
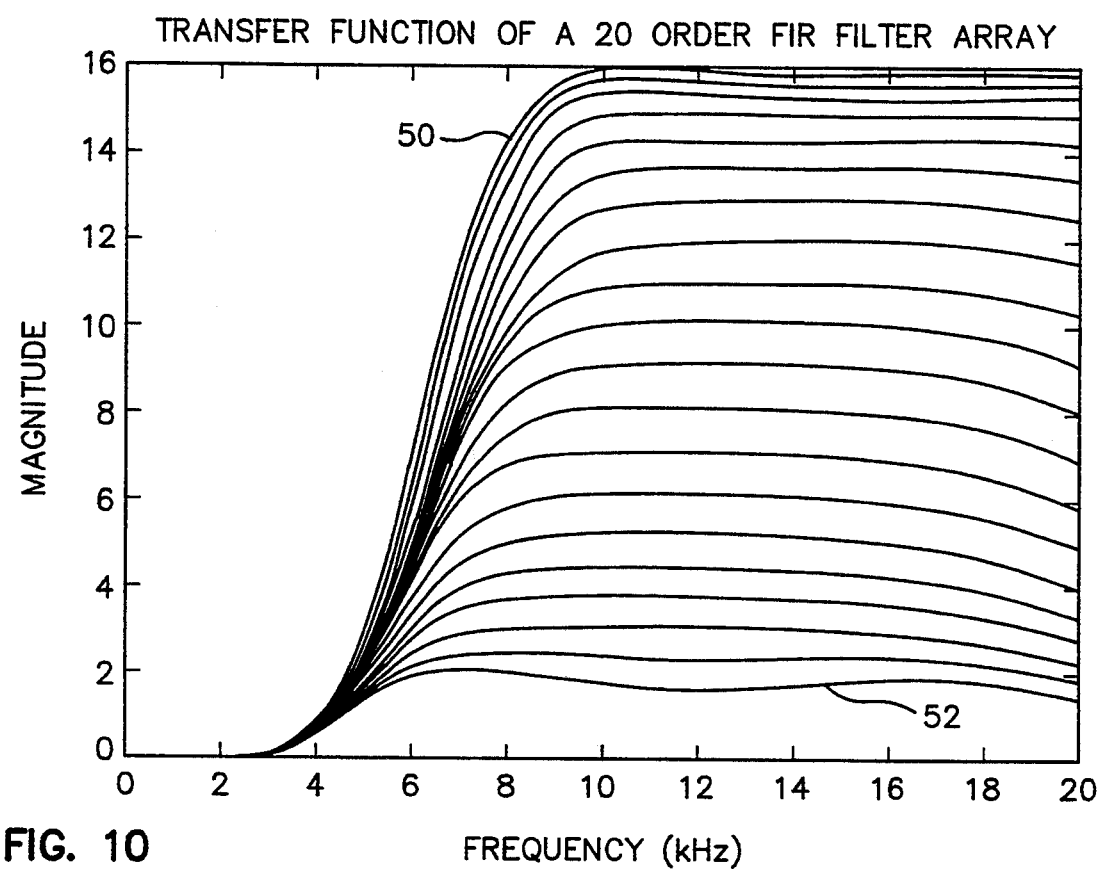
FIG. 10 shows the sensor array transfer function provided by the illustrative FIR filter embodiment of FIG. 9.

FIG. 9 shows a set of computed transfer functions $\{H_m(\omega)\}$ over a frequency band from 5 kHz to 20 kHz for each sensor in an exemplary 25 element array, from m=0 (curve 46) to m=12 (curve 48). The transfer functions in FIG. 9 are sufficient to equalize a 2M+1=25-element array. At lower frequencies in the band, $H_m(\omega)$ has a value equivalent to the Gaussian window weight $(\alpha_0) = 1.5$. As frequency increases, $H_{12}(\omega)$ for the two end sensors (m=12), shown as curve 48, falls to zero and $H_0(\omega)$ for the middle sensor (curve 46) increases. The resulting beam power over the predetermined frequency band [$\omega_a, \omega_b$] for the exemplary 25-element array is shown in FIG. 10. The filters in FIG. 9 are realized using 21-tap Finite-Impulse-Response (FIR) transversal filters with symmetric tap weights. The curves in FIG. 10 correspond to different directions of arrival (spatial beam signal angles), ranging from zero degrees (curve 50) to about 15 degrees (curve 52). The directional sensitivity is substantially uniform over the 5 kHz to 20 kHz operating band, as required for proper HJ network performance.

The relative bandwidth ratio is defined as:

$$r^d = \frac{\omega_b - \omega_a}{\sqrt{\omega_a\omega_b}}, \quad \text{[Eqn. 15]}$$

which is r=1.5 in the example discussed above in connection with FIGS. 9–10. For underwater communication applications, a ratio of 1.5 provides adequate bandwidth for most practical purposes. For the "cocktail party" problem discussed hereinabove, the frequency band of interest is from 300 Hz to 5000 kHz, which corresponds to r=3.84. To obtain a uniform beam over such a wide frequency band, two collocated sensor arrays should be used to form the beams; one array operating from 300 Hz to 1200 Hz (r=1.5) and a second array operating from 1.2 kHz to 5 kHz (r=1.55). These two sensor arrays should be collocated and their outputs superimposed to form the desired independent combinations of source signals.

System Implementation and Operation

Figure 11:
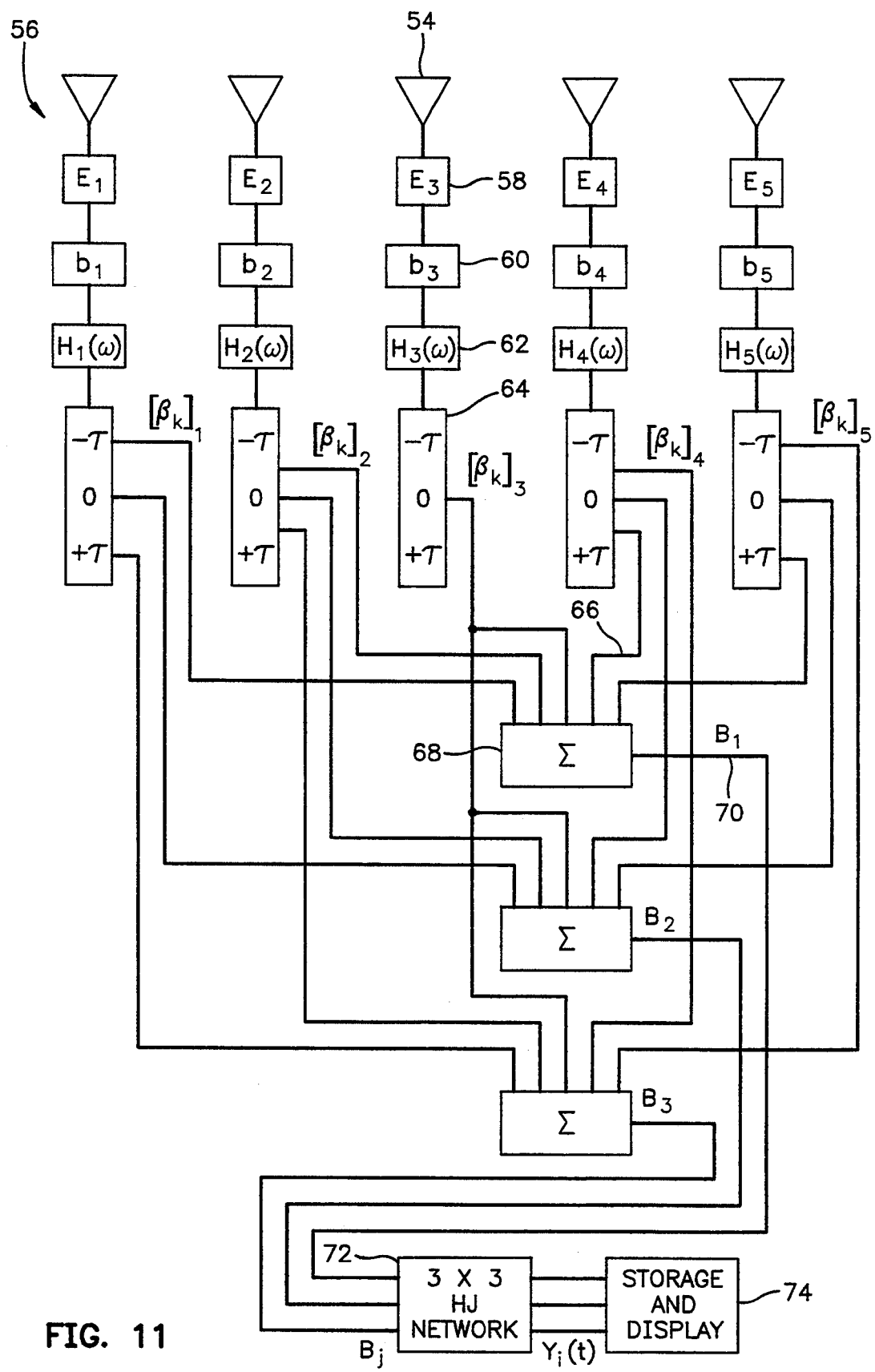
FIG. 11 provides a functional block diagram of the system of this invention.

FIG. 11 shows a functional block diagram of an illustrative embodiment of the system of this invention. The example in FIG. 11 assumes an array length of five sensors and a total of three independent spatial beam signals. The system of FIG. 11 is suitable for application to the problem shown in FIG. 3.

The sensor elements are exemplified by sensor element 54 in the middle of the sensor array 56. These elements may be acoustic transducers, microphones, dipole antennas or the like. Sensor element 54 is presumed to be omnidirectional in the hemisphere beyond the boundaries of array 56.

Sensor element 54 is connected to a transducer matching network 58, which operates to convert the signal received by sensor element 54 into a sensor output signal $E_i$. This sensor output signal, exemplified by $E_3$, is then multiplied by an array shading factor $b_i$, exemplified by $b_3$ at the multiplier 60. The shaded signal $b_3E_3$ is presented to a filter network $H_i(\omega)$, exemplified by $H_3(\omega)$ at the filter network 62. Network 62 is required only for broadband source signal applications, as discussed above in connection with Eqns. 8–14, and the array shading function may be subsumed in the filter function for broadband operation.

The output signal from filter network 62 is presented to the input of a delay line 64. Delay line 64 has several time delay taps available, as exemplified by the taps labelled $-\tau$, 0 and $+\tau$. Because delay line 64 is coupled to the center element 54, only the $0^{th}$ tap is used. Each of the five sensor signals is delayed by a linearly progressive amount corresponding to a sensor phasing vector $[\beta_k]_j$ having five phases $\beta_k = \omega \tau_k$. The five delayed signals $[E_k]_j$, exemplified by signal 66, are then summed in a summing network exemplified by summer 68. The output of summer 68 is the spatial beam signal $B_j(t)$, exemplified by signal $B_1$ on line 70.

The three independent spatial beam signals $\{B_j\}$ are then presented to the inputs of a 3×3 HJ network 72. Network 72 has three outputs $\{Y_i(t)\}$, which represent estimates of up to three original source signals (not shown) for which no prior information is known. Outputs $\{Y_i(t)\}$ from Eqn. 3 can be expressed here as:

$$\begin{bmatrix} Y_1(t) \\ Y_2(t) \\ Y_3(t) \end{bmatrix} = \begin{bmatrix} 1 & c_{12} & c_{13} \\ c_{21} & 1 & c_{23} \\ c_{31} & c_{32} & 1 \end{bmatrix}^{-1} \begin{bmatrix} B_1(t) \\ B_2(t) \\ B_3(t) \end{bmatrix} \rightarrow \begin{bmatrix} S_1(t) \\ S_2(t) \\ S_3(t) \end{bmatrix} \quad [\text{Eqn. 16}]$$

Finally, the estimated output signals $\{Y_i(t)\}$ are stored and displayed in a storage and display system 74 in any useful manner known in the art.

The functional elements described above in connection with FIG. 11 may be realized in either digital or analog form. The HJ network 72 is preferably an analog realization such as is well-known in the art. Digital embodiments of the beamformer elements offer bandwidth and dynamic range advantages whereas analog implementations offer simplicity and relatively low cost.

For instance, FIR digital filters can be used to implement $H_m(\omega)$ of Eqn. 14 using DSP chips. FIR filters are preferred for their linear phase property, which is necessary for proper function of the beamformer of this invention. A useful filter bank of transfer functions $\{H_m(\omega)\}$ shown in FIG. 9 can be realized according to the expression:

$$y(n\Delta T) = B_o x(n\Delta T) + \sum_{i=1}^{L} B_i [x(n\Delta T - i\Delta T) + x(n\Delta + i\Delta T)] \quad [\text{Eqn. 17}]$$

where $B_i (i=0,L)$ are the first $L+1$ coefficients of the inverse discrete Fourier transform of $H_m(\omega)$.

Analog implementation of the system of this invention is also useful. The main computational burden of the digital implementation suggested above is the solution of N equations (Eqn. 3) in real time at the Nyquist sampling rate. When the number of sources N becomes large and the sampling frequency is high, analog implementation is superior to the general-purpose DSP chip implementation because it can preprocess the enormous amount of data from the sensor array, separate the signals among the paths with moderate accuracy, and then present the resulting signals to a digitally-implemented detector.

Analog VLSI HJ network chips already exist and it should be possible to implement the entire system, including the filter bank, beamformer and HJ network using CMOS analog VLSI technology on a single chip. The filter bank can be implemented using charge-coupled device (CCD), bucket brigade device (BBD) or switched-capacitor (SC) transversal filter technology or perhaps a linear-phase transconductance capacitor filter. The inventors have successfully implemented a CMOS 3-order Bessel transconductance capacitor filter bank and a BBD beamformer with 15 microphone inputs and 6 beams, so single chip integration should be possible without undue experimentation.

Figure 12:
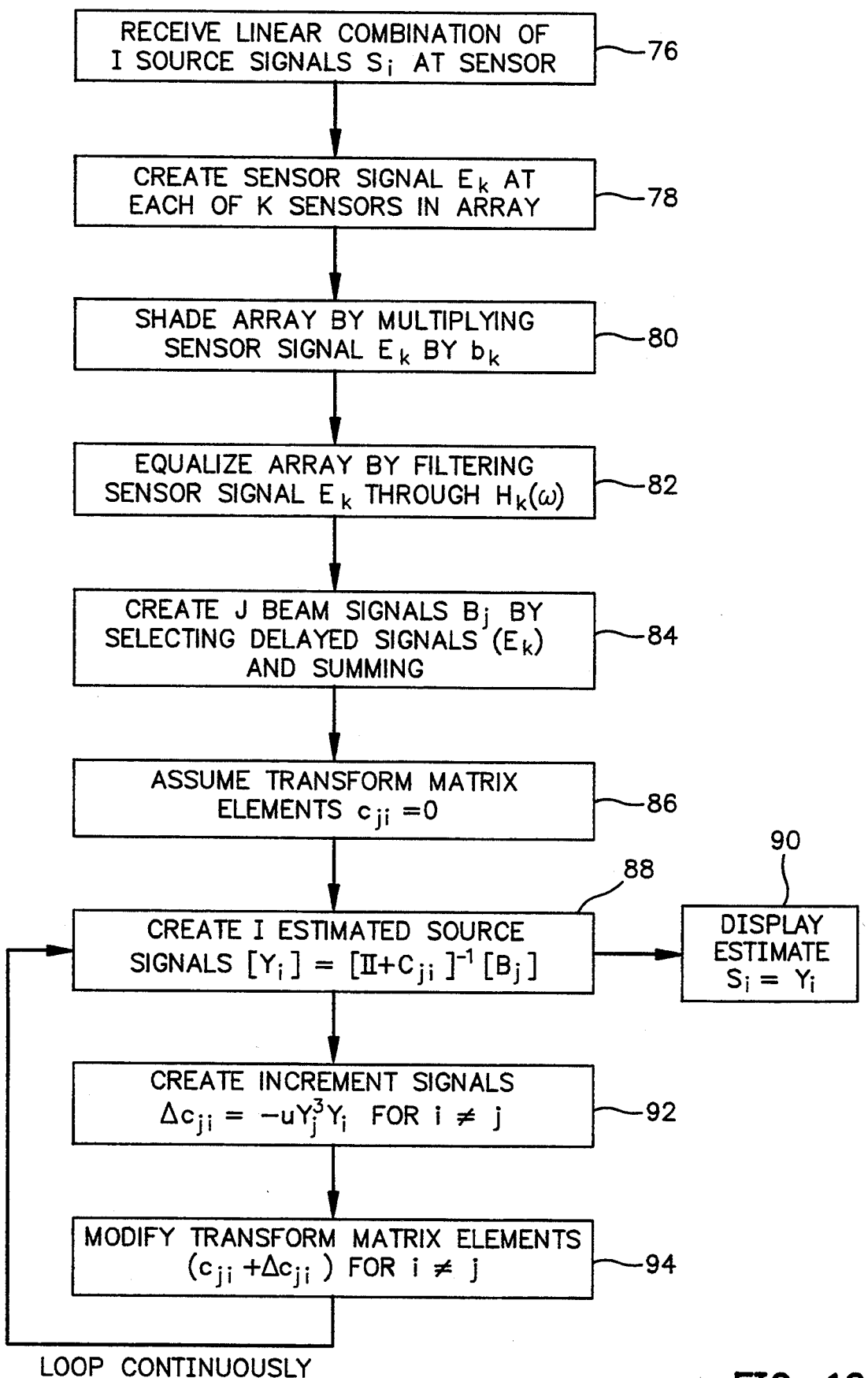
FIG. 12 provides a simple flow chart illustrating the signal recovery method of this invention.

FIG. 12 provides a summary of the signal discrimination procedure of this invention. In the first step 76, the K sensors each receive a linear combination of I source signals $\{S_i(t)\}$ in the manner discussed hereinabove. In the next step 78, a sensor signal $E_k(t)$ is created responsive to the received signals at each of K sensors in the sensor array. These sensor signals are then shaded by multiplying each by a scalar weighting factor $b_k$ in step 80. If the source signals are broadband, then step 82 is added to equalize the array over a predetermined frequency range by filtering each sensor signal $E_k(t)$ through a filter function $H_k(\omega)$ selected according to the method discussed above in connection with FIGS. 9–10. Equalizing step 82 is followed by a beamforming step 84 wherein J beam signals $\{B_j(t)\}$ are each created by delaying the filtered sensor output signals according to a $j^{th}$ phasing vector $[\beta_k]_j$ and summing them to form the $j^{th}$ spatial beam signal.

The $J \leq I$ spatial beam signals are then presented to an I by I HJ network. Initially, the HJ network transform matrix $[C_{ij}]$ is assumed populated with zero-valued elements $\{c_{ij}\}$ in step 86. With these assumed values, the HJ network then creates I estimated source signals $\{Y_i(t)\}$ in accordance with step 88 in FIG. 12. These estimated source signals are then immediately displayed as initial solutions to the blind source separation problem in step 90. After the first estimated source signals $\{Y_i(t)\}$ are available, a transform increment signal $\Delta c_{ij} = d c_{ij}/dt$ is created (according to Eqn. 4) in step 92 for each element of the HJ transform matrix $[C_{ij}]$. The HJ transform matrix elements $\{c_{ij}\}$ are then updated in step 94 in accordance with the increment signals $\{\Delta c_{ij}\}$. After the updated element values of $[C_{ij}]$ are available, control is returned to step 88 and new estimated source signals $\{Y_i(t)\}$ are generated accordingly. These are also displayed in step 90.

It should be appreciated that the series of steps illustrated in FIG. 12 are performed continuously and are amenable to either continuous analog performance or incremental performance in discrete time.

Inventor Simulation Results

The inventors simulated a 2×2 HJ network with a 2-beam array for a 2-path channel. The array had $2M+1 = 25$ sensors. One formed beam is aimed at zero degrees and the other beam is aimed at 10 degrees, relative to array normal. The simulated direct path source signal $S_1$ arrives from two degrees and the reflected path source signal $S_2$ arrives from eight degrees with a delay of 12.75 ms. The source signal used in the simulation is a biphase-shift-keying (BPSK) signal and the carrier frequency is 14 kHz. The bit rate is 5 kB. The frequency operating band is $\omega_a = 5$ kHz to $\omega_b = 20$ kHz. The filter bank consists of 21-tap finite-impulse-response (FIR) digital filters designed to realize the $H_m(\omega)$ shown in Eqn. 14. FIG. 10 shows the output beam power of the resulting beamformer, which is substantially constant over the predetermined frequency range. The simulation was carried out in the time domain. The carrier synchronization uses a matched filter to convolve the received signal with a time-reversed replica of the transmitted signal.

As the delay time between the different paths increases, unlike the conventional equalization filter that requires additional taps, there is no penalty in the system of this invention because the signal and its delayed versions are treated as two uncorrelated signals. That is, the information in the signal bandwidth and the angle-of-arrival is sufficient to resolve the two different signal paths. Time delay estimation, which is difficult in underwater channels, can be performed after the multipath signals are detected in this example. The primary signal and its multipath "ghosts" can be considered as uncorrelated when the multipath delay is longer than a symbol length and there is no correlation between adjacent bits transmitted. If the adjacent bits prove to be correlated, decorrelation may be achieved by modulating the transmitted bit train with a pseudorandom train that has the same bit rate as the data. When the delay time is smaller than the symbol length, which is 0.2 ms in this simulation example, the HJ network cannot generally converge. Thus, for short delay times, the spread-spectrum technique should be used to reduce the symbol length. Practically, the long delay times are of more concern than very short delay times. A 0.2 ms delay represents only a 6.8 cm path length difference in air and 30 cm in water. These short lengths are further decreased at higher signal bit rates.

Figure 13:
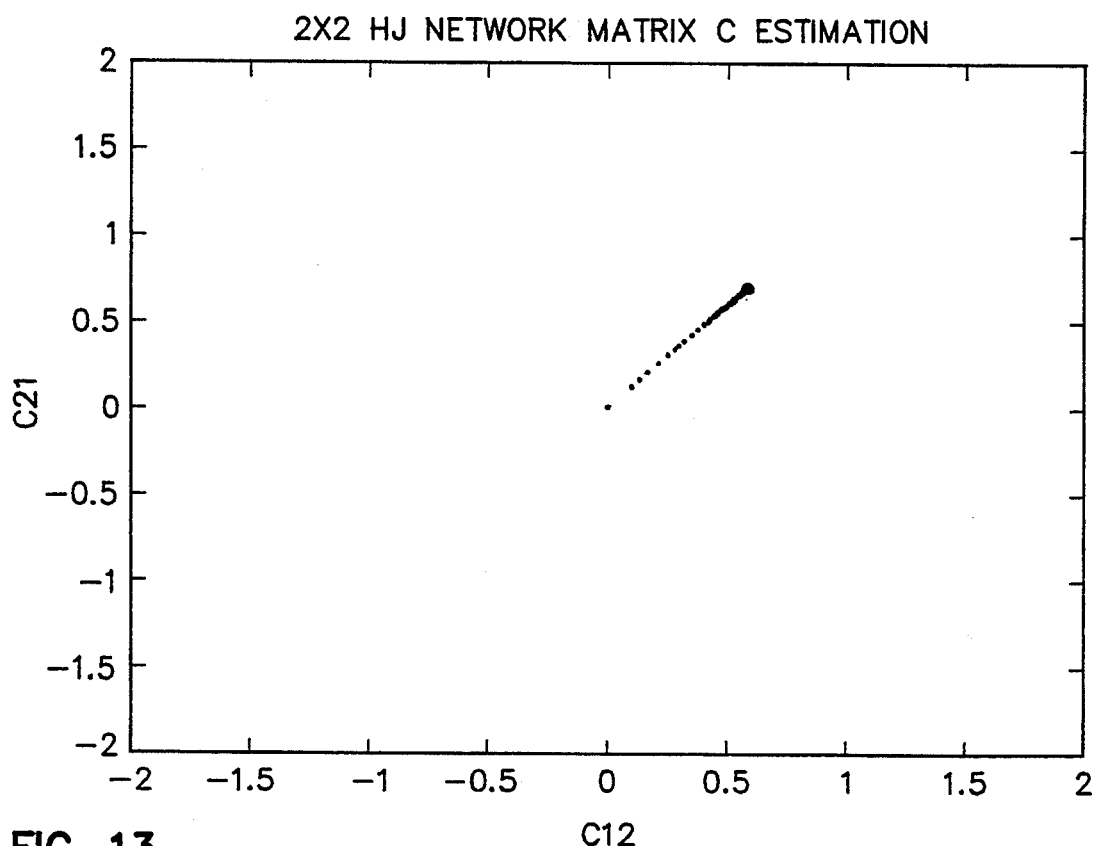
FIG. 13 shows an illustrative estimation matrix convergence pattern for a $2 \times 2$ HJ network.

FIG. 13 shows the adaptation process of the 2×2 HJ network used to process the two spatial beam outputs of the simulated 25-element array. The two transform signals $c_{12}$ and $c_{21}$ are shown plotted as ordinate and abscissa, respectively. These are set to zero at the beginning of the adaptation. The adaptor functions are defined as $f(s)=s^3$ and $g(s)=s$ for $c_{12}$ and $c_{21}$ in the HJ network simulation. The adaptation rate parameter is set to $\mu=0.2$ (see Eqn. 4).

Two types of white noise is considered in the simulation. One is the noise associated with the source signal, which can be treated as an independent signal if it is strong enough. The other is non-directional noise that includes the surrounding noise field in the channel and the electronic noise from the receive circuitry. With these noise sources, Eqn. 7 becomes:

$$E(t)=A[X(t)+W_1(t)]+W_2(t) \quad (18)$$

where $W_1(t)$ and $W_2(t)$ are independent white Gaussian random vectors with the power spectral densities $S_{w1}$ and $S_{w2}$, respectively. The signal-to-noise ratios used in the simulation are $10 \log_{10}(S/S_{w1})=7$ dB and $10 \log_{10}(S/S_{w2})=27$ dB. Note that the quantities $c_{12}$ and $c_{21}$ quickly converge to stable and correct values in FIG. 13.

Figure 7A:
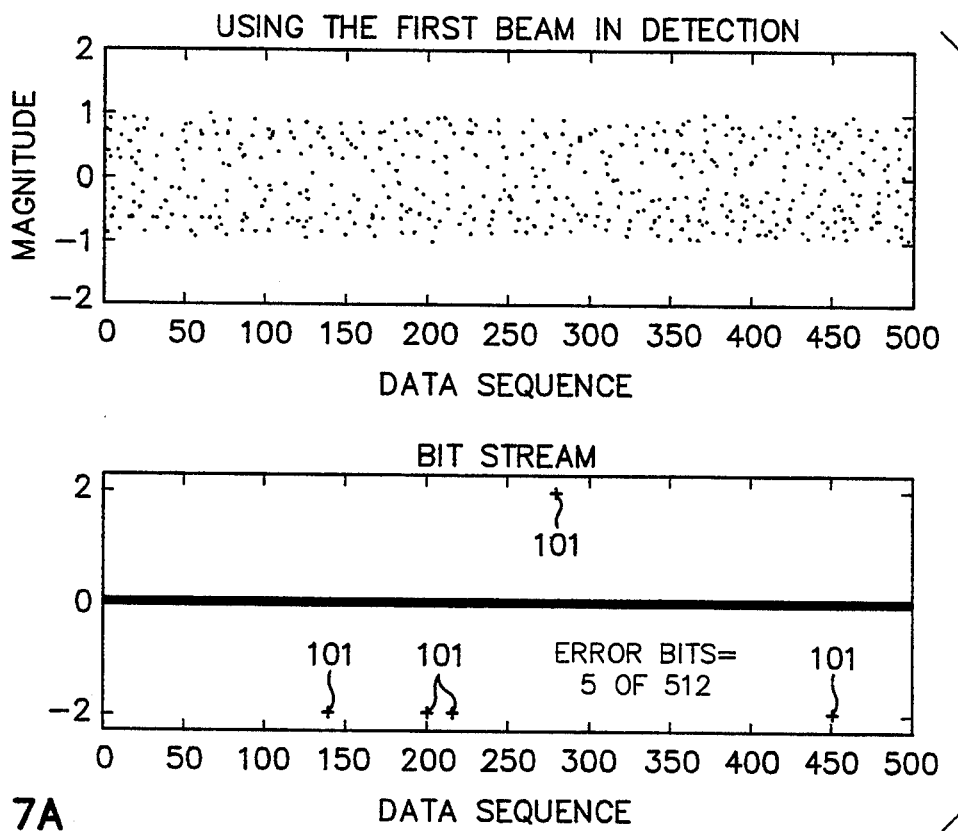
FIG. 7, comprising FIGS. 7A and 7B, compares the effects of applying the system of this invention to a first example problem.

FIG. 7A shows the detection of an exemplary bit train using only the zero degree beam output signal. The detection is of a BPSK data stream of 512 bits spanning 0.1 seconds using only the beam aimed at zero degrees without filter equalization. When a bit is transmitted correctly, there is a plus located at zero. There were five bit errors 101 shown in the lower panel of FIG. 7A, which is a bit error rate (BER)=5/512.

Figure 7B:
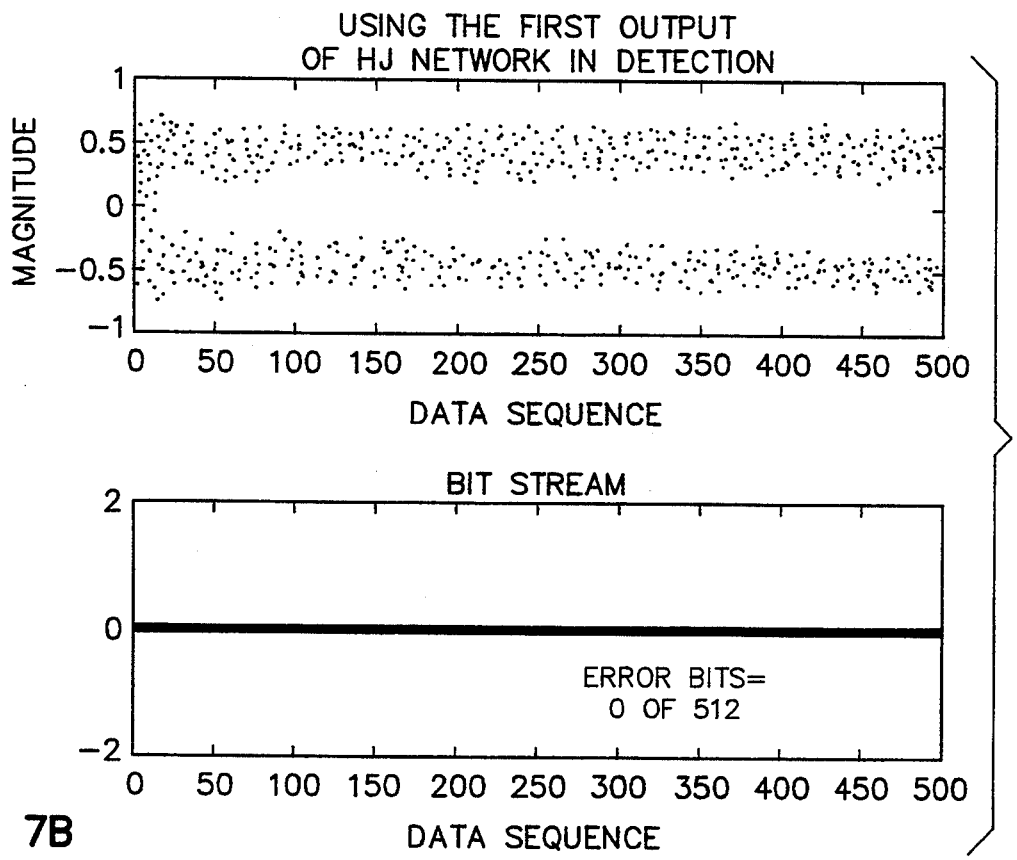

FIG. 7B shows the detection of the same bit train using one of the HJ network outputs. The first 30 data bits are received with about the same BER as in FIG. 7A. After the HJ network converges, the transmission is error-free. Similar results were noted for the other beam output signal.

Inventor simulation results show that when the adaptation rate parameter $\mu$ is increased, the adaptation speed increases but the fluctuation of the final values of $c_{12}$ and $c_{21}$ about the correct values also increases. Thus, there is a trade-off between the adaptation speed parameter $\mu$ and the separation accuracy. When the direction of signal arrivals in the underwater acoustic channels rapidly change, the degree of separation suffers. In the simulation, $c_{12}$ and $c_{21}$ adapted from random initial conditions to their correct values within 10 to 20 ms. Thus, the system of this invention is fast enough to handle time-variant fading in reverberant underwater acoustic channels.

The method of this invention can be used in underwater acoustic communications where several constantly changing paths usually exist, resulting in severe intersymbol interference (ISI) in the data link. Unlike other methods proposed for reducing ISI and multipath fading channels through treating the other multipath signals as noise or through high computational loads resulting in long delays, the system of this invention can recover information from each path without using training signals. It is therefore possible to achieve faster signal transmission rates than with other methods. Inventor simulations show that the system of this invention can significantly reduce the data error rate (FIG. 7B) and is a practical approach to reliable high-speed acoustic telemetry. Also, in the "cocktail party" problem, the system of this invention can be used to separate various voice and music sources in a videoconferencing system. Although the HJ network is preferred, other adaptation methods may also be usefully applied to the system of this invention.

Analog implementation should be realizable in a single analog VLSI chip, forming a very compact system. Digital implementation is suitable for the "cocktail party" problem requiring a relatively low sampling rate for audio frequencies. The system of this invention may be applied to broadband channels by linking multiple narrower band beamformer and HJ network arrays together.

Clearly, other embodiments and modifications of our invention will occur readily to those of ordinary skill in the art in view of these teachings. Therefore, our invention is to be limited only by the following claims, which include all such embodiments and modifications when viewed in conjunction with the above specification and accompanying drawing.

We claim:

1. A method for recovering at least one of a plurality I of source signals $\{S_i\}$, each said source signal $S_i$ arriving at a receiver from one of a plurality J of directions $\{D_j\}$, said receiver including a plurality K of sensors each having a sensor output signal $E_k$, wherein i, j and k are non-zero positive integers and I, J and K are positive integers greater than unity, said method comprising:

creating a plurality K of said sensor output signals $\{E_k\}$ responsive to said plurality I of source signals $\{S_i\}$;

multiplying said sensor output signals $\{E_k\}$ by predetermined shading factors $\{b_k\}$ to create a plurality K of shaded sensor output signals $\{b_k E_k\}$;

delaying said shaded sensor output signals $\{b_k E_k\}$ by means of a plurality J of phasing vectors $[\beta_k]$ to produce a plurality J·K of delayed shaded sensor output signals $[b_k E_k]_j$ and combining said delayed shaded sensor output signals to create a plurality J of spatial beam signals $\{B_j\}$ such that $$B_j = \sum_{k=1}^{K} b_k E_k(t - \lambda_k \sin\beta_{kj}),$$

wherein t is time and $\lambda_k$ is a predetermined constant; and producing an estimated source signal $Y_i$ at an output such that $Y_i = \epsilon B_j$, wherein said estimated source signal $Y_i$ corresponds to said at least one source signal $S_i$, $\epsilon$ is a predetermined constant, and said shaded sensor output signals $\{b_k E_k\}$ are filtered by means of a filter characteristic $H_k(\omega)$ substantially equivalent to $$H_k(\omega) = \gamma(\omega) e^{\frac{-k2}{\alpha(\omega)}} + \delta(\omega),$$

wherein $\alpha(\omega)$, $\delta(\omega)$ and $\gamma(\omega)$ are predetermined functions of frequency $\omega$ selected such that each said spatial beam signal $B_j$ is unchanging over a predetermined continuous frequency band.

2. The method of claim 1 wherein said predetermined functions $\alpha(\omega)$, $\delta(\omega)$ and $\gamma(\omega)$ are selected such that $$[\alpha(\omega), \delta(\omega), \gamma(\omega)] =$$

$$\arg \min_{\alpha,\delta,\gamma} \int_0^{\tau_o} \left[ \sum_{k=1}^{K} (e^{\frac{-k2}{\alpha_o}} \cos(k\omega_o \tau) - (\gamma e^{\frac{-k2}{\alpha}} + \delta)\cos(k\omega \tau)) \right]^2 d\tau,$$

wherein $\tau$ is a steering angle time delay in the interval $[0, \tau_o]$, said interval including delays for said plurality J of directions $\{D_j\}$, $\omega_0$ is a frequency within said predetermined continuous frequency band, $\alpha_o = \alpha(\omega_0)$, $\alpha = \alpha(\omega)$, $\delta = \delta(\omega)$, and $\gamma = \gamma(\omega)$.

3. The method of claim 2 wherein said receiver comprises $K = 2M+1$ sensor elements uniformly spaced in a line, wherein M is a non-zero positive integer.

4. The method of claim 1 wherein said producing step further incorporates the step of:

updating a plurality of transform signals $\{c_{ij}\}$ by means of successive approximation to create an adaptive transform matrix $[C_{ij}]$ such that said estimated source signal $Y_i = \epsilon[C_{ij}][B_j]$.

5. A method for recovering at least one of a plurality I of source signals $\{S_i\}$ in a communications system, wherein each said source signal $S_i$ arrives at a receiver from one of a plurality J of directions $\{D_j\}$, said receiver including a plurality K of sensors each having a sensor output signal $E_k$, where i, j and k are nonzero positive integers and I, J and K are positive integers greater than unity, said method comprising:

creating a plurality K of said sensor output signals $\{E_k\}$ in response to said plurality I of source signals $\{S_i\}$;

creating a plurality J of spatial beam signals $\{B_j\}$ in response to said sensor output signals $\{E_k\}$ such that $$B_j = \sum_{k=1}^{K} b_k E_k(t - \lambda_k \sin\beta_{kj}),$$

wherein t is time and $\beta_{kj}$, $b_k$ and $\lambda_k$ are predetermined constants; and producing one or more of said estimated source signals $\{Y_i\}$ in response to said plurality a of spatial beam signals $\{B_j\}$ and a plurality I.J of transform signals $\{c_{ji}\}$, wherein each estimated source signal $Y_i$ corresponds to one of said source signals $\{S_i\}$ and said plurality I.J of transform signals $\{c_{ij}\}$ corresponds to a transform matrix updated by successive approximation of a plurality I of estimated source signals $\{Y_i\}$ and by successive addition to each said transform signal $c_{ji}$ of an increment signal $\Delta C_{ji} = (-\mu)f(Y_j)g(Y_i)$, wherein $[Y_j] = [II + C_{ji}]^{-1}[B_j]$, [II] is the unit matrix, $\mu$ is a predetermined constant and f(x) and g(x) are predetermined odd functions of x.

6. A method for recovering at least one of a plurality I of source signals $\{S_i\}$, each said source signal $S_i$ arriving at a receiver from one of a plurality J of directions $\{D_j\}$, said receiver including a plurality K of sensors each having a sensor output signal $E_k$, wherein i, j and k are nonzero positive integers and I, J and K are positive integers greater than unity, said method comprising:

creating a plurality K of said sensor output signals $\{E_k\}$ responsive to said plurality I of source signals $\{S_i\}$;

multiplying said sensor output signals $\{E_k\}$ by predetermined shading factors $\{b_k\}$ to create a plurality K of shaded sensor output signals $\{b_k E_k\}$;

delaying said shaded sensor output signals $\{b_k E_k\}$ by means of a plurality J of phasing vectors $[\beta_k]_i$ to produce a plurality J·K of delayed shaded sensor output signals $[b_k E_k]_j$ and combining said delayed shaded sensor output signals to create a plurality J of spatial beam signals $\{B_j\}$; and repeatedly performing the steps of combining said spatial beam signals $\{B_j\}$ to create a plurality I of estimated source signals $\{Y_i\}$ so that $[Y_i] = [II + C_{ji}]^{-1}[B_j]$, wherein [II] is the unit matrix and $[C_{ji}]$ is an adaptive transform matrix corresponding to a plurality J·K of transform signals $\{c_{ji}\}$;

adjusting said transform signals $\{c_{ji}\}$ in response to said estimated source signals $\{Y_i\}$ to correct said adaptive transform matrix $[C_{ji}]$; and producing at least one of said estimated source signals $\{Y_i\}$, wherein said produced estimated source signal corresponds to said at least one of said source signals $\{S_i\}$.

7. The method of claim 6 wherein:

said delaying step is performed such that said spatial beam signal $$B_j = \sum_{k=1}^{K} b_k E_k(t - \lambda_k \sin\beta_{kj}),$$

wherein t is time and $\lambda_k$ is a predetermined constant; and said adjusting step is performed such that each of said transform signals $\{c_{ji}\}$ is adjusted by an increment signal $\Delta C_{ji} = (\mu)f(Y_j)g(Y_i)$, wherein $\mu$ is a predetermined constant and f(x) and g(x) are predetermined odd functions of x, respectively.

8. The method of claim 7 further comprising:
filtering said shaded sensor output signals $\{b_k E_k\}$ by means of a filter characteristic $H_k(\omega)$ substantially equivalent to $$H_k(\omega) = \gamma(\omega) \, e^{\frac{-k2}{\alpha(\omega)}} + \delta(\omega),$$

wherein $\alpha(\omega)$, $\delta(\omega)$, and $\gamma(\omega)$ are predetermined functions of frequency $\omega$ selected such that each spatial beam signal $B_j$ is unchanging over a predetermined continuous frequency band.

9. The method of claim 8 wherein said predetermined functions $\alpha(\omega)$, $\delta(\omega)$ and $\gamma(\omega)$ are selected such that $$[\alpha(\omega), \delta(\omega), \gamma(\omega)] = \arg \min_{\alpha,\delta,\gamma} \int_0^{T_o} \left[ \sum_{k=1}^{K} (e^{\frac{-k2}{\alpha_o}} \cos(k\omega_o \tau) - (\gamma e^{\frac{-k2}{\alpha}} + \delta)\cos(k\omega \tau)) \right]^2 d\tau,$$

wherein $\tau$ is a steering angle time delay in the interval $[0, \tau_o]$, said interval including delays for said plurality J of directions $\{D_j\}$, $\omega_0$ is a frequency within said predetermined continuous frequency band, $\alpha_o = \alpha(\omega_0)$, $\alpha = \alpha(\omega)$, $\delta = \delta(\omega)$, and $\gamma = \gamma(\omega)$.

10. The method of claim 6 wherein said receiver comprises $K=2M+1$ sensor elements uniformly spaced in a line, wherein M is a nonzero positive integer.

11. A system for separating a plurality I of source signals $\{S_i\}$, each said source signal $S_i$ arriving from one of a plurality J of directions $\{D_j\}$, said system comprising:
sensor array means having a plurality K of sensors for receiving said source signals $\{S_i\}$;
transducer means in each sensor for creating a sensor output signal $E_k$ in response to plurality I of source signals $\{S_i\}$;
beamformer means coupled to said sensor array means for creating a plurality J of spatial beam signals $\{B_j\}$ in response to said plurality K of sensor output signals $\{E_k\}$;
broadband shading means coupled to said sensor array means for adjusting said plurality K of sensor output signals $\{E_k\}$ over a predetermined frequency band for equalizing the amplitude response of said sensor array means over said predetermined frequency band; and
output means coupled to said beamformer means and said broadband shading means for generating a plurality I of output signals $\{Y_i\}$ corresponding to estimates of said source signals $\{S_i\}$, wherein i, j and k are nonzero positive integers and I, J and K are positive integers greater than unity.

12. The system of claim 11 wherein said broadband shading means comprises a plurality K of filter means having filter characteristics $\{H_k(\omega)\}$, wherein $$H_k(\omega) = \gamma(\omega) \, e^{\frac{-k2}{\alpha(\omega)}} + \delta(\omega),$$

wherein $\alpha(\omega)$, $\delta(\omega)$, and $\gamma(\omega)$ are predetermined functions of frequency $\omega$ selected such that each said spatial beam signal $B_j$ is unchanging over said predetermined continuous frequency band.

13. The system of claim 12 wherein said predetermined functions $\alpha(\omega)$, $\delta(\omega)$ and $\gamma(\omega)$ are selected such that $$[\alpha(\omega), \delta(\omega), \gamma(\omega)] = \arg \min_{\alpha,\delta,\gamma} \int_0^{T_o} \left[ \sum_{k=1}^{K} (e^{\frac{-k2}{\alpha_o}} \cos(k\omega_o \tau) - (\gamma e^{\frac{-k2}{\alpha}} + \delta)\cos(k\omega \tau)) \right]^2 d\tau,$$

wherein $\tau$ is a steering angle time delay in the interval $[0, \tau_o]$, said interval including delays for said plurality J of directions $\{D_j\}$, $\omega_0$ is a frequency within said predetermined continuous frequency band, $\alpha_o = \alpha(\omega_0)$, $\alpha = \alpha(\omega)$, $\delta = \delta(\omega)$, and $\gamma = \gamma(\omega)$.

14. A system for separating a plurality I of source signals $\{S_i\}$, each said source signal $S_i$ arriving from one of a plurality J of directions $\{D_j\}$, said system comprising:
sensor array means having a plurality K of sensors for receiving said source signals $\{S_i\}$;
transducer means in each sensor for creating a sensor output signal $E_k$ in response to said plurality I of source signals $\{S_i\}$;
beamformer means coupled to said sensor array means for creating a plurality J of spatial beam signals $\{B_j\}$ in response to said plurality K of sensor output signals $\{E_k\}$;
transform means coupled to said beamformer means for creating and storing a plurality I.J of transform signals $\{c_{ji}\}$ corresponding to an adaptive transform matrix $[C_{ji}]$;
output means coupled to said beamformer means and said transform means for generating a plurality I of output signals $\{Y_i\}$ corresponding to estimates of said source signals $\{S_i\}$ such that $[Y_i]=[II+C_{ji}]^{-}[B_j]$, wherein $[II]$ is the unit matrix; and
adaptive transform means coupled to said output means and said transform means for adjusting each of said plurality I.J of transform signals $\{c_{ji}\}$ in response to an increment signal $\Delta c_{ji}=(\mu)f(Y_j)g(Y_i)$, wherein $\mu$ is a predetermined constant and f(x) and g(x) are predetermined odd functions of x, wherein i, j and k are nonzero positive integers and I, J and K are positive integers greater than unity.

15. The system of claim 14 wherein said plurality K of sensors are disposed on a plane and said beamformer means creates said plurality J of spatial beam signals $\{B_j\}$ such that $$B_j = \sum_{k=1}^{K} b_k E_k(t - \lambda_k \sin \beta_{kj})$$

for said direction $D_j$, wherein t is time and $\beta_{kj}$, $\lambda_k$ and $b_k$ are predetermined constants.

16. The system of claim 15 wherein said plurality $K=2M+1$, wherein M is a nonzero positive integer.

17. The system of claim 14 further comprising:
broadband shading means coupled to said sensor array means for adjusting said plurality K of sensor output signals $\{E_k\}$ over a predetermined frequency band for equalizing the amplitude response of said sensor array means over said predetermined frequency band.

18. The system of claim 17 wherein said broadband shading means comprises a plurality of finite-impulse-response filters each coupled to at least one of said plurality K of sensors.

19. The system of claim 14 wherein said plurality I of source signals $\{S_i\}$ comprises acoustic signals and said sensor array means comprises a plurality of acoustic transducers.

20. The system of claim 14 wherein said plurality I of source signals $\{S_i\}$ comprises electromagnetic signals and said sensor array means comprises a plurality of antenna elements.

21. A system for adaptive cancellation of one or more interferer signals $\{S_i\}$ in a signal receiver having a sensor array with a plurality K of sensors, said system comprising:

transducer means in each sensor for creating a sensor output signal $E_k$ in response to a plurality 1 of said interferer signals $\{S_i\}$;

beamformer means coupled to said sensor array for creating a plurality J of spatial beam signals $\{B_j\}$ in response to said plurality K of sensor output signals $\{E_k\}$;

transform means coupled to said beamformer means for creating and storing a plurality I.J of transform signals $\{c_{ji}\}$ corresponding to an adaptive transform matrix $[C_{ji}]$;

output means coupled to said beamformer means and said transform means for signals $\{S_i\}$ such that $[Y_i] = [II + C_{ji}]^{-1} [B_j]$, wherein [II] is the unit matrix; and adaptive transform means coupled to said output means and said transform means for adjusting each of said plurality I.J of transform signals $\{c_{ji}\}$ in response to an increment signal $\Delta c_{ji} = (\mu) f(Y_j) g(Y_i)$, wherein $f(x)$ and $g(x)$ are predetermined odd functions of $x, \mu$ is a predetermined constant, i, j and k are nonzero positive integers and I, J and K are positive integers greater than unity.

22. The system of claim 21 wherein said plurality K of sensors are disposed on a plane and said beamformer means creates said plurality J of spatial beam signals $\{B_j\}$ such that $$B_j = \sum_{k=1}^{K} b_k E_k(t - \lambda_k \sin \beta_{kj})$$

for said direction $D_j$, wherein t is time and $\beta_{kj}$, $\lambda_k$ and $b_k$ are predetermined constants.

23. The system of claim 22 wherein said plurality K=2M+1, wherein M is a nonzero positive integer.

24. The system of claim 21 further comprising:
broadband shading means coupled to said sensor array means for adjusting said plurality K of sensor output signals $\{E_k\}$ over a predetermined frequency band to equalize the amplitude response of said sensor array means over said predetermined frequency band.

25. The system of claim 24 wherein said broadband shading means comprises a plurality of finite-impulse-response filters each coupled to at least one of said plurality K of sensors.

26. A system for separating a plurality 1 of source signals $\{S_i\}$ in an underwater acoustic communications system, each said source signal $S_i$ arriving from one of a plurality J of directions $\{D_j\}$, said system comprising:

sensor array means having a plurality K of acoustic sensors for receiving said plurality I of source signals $\{S_i\}$;

transducer means in each acoustic sensor for creating a sensor output signal $E_k$ in response to said plurality I of source signals $\{S_i\}$;

beamformer means coupled to said sensor array means for creating a plurality J of spatial beam signals $\{B_j\}$ in response to said plurality K of sensor output signals $\{E_k\}$;

transform means coupled to said beamformer means for creating and storing a plurality I.J of transform signals $\{c_{ji}\}$ corresponding to an adaptive transform matrix $[C_{ji}]$;

output means coupled to said beamformer means and said transform means for generating a plurality I of output signals $\{Y_i\}$ corresponding to estimates of said source signals $\{S_i\}$ such that $[Y_i] = [II + C_{ji}]^{-1} [B_j]$, wherein [II] is the unit matrix; and adaptive transform means coupled to said output means and said transform means for adjusting each of said plurality I.J of transform signals $\{c_{ji}\}$ in response to an increment signal $\Delta C_{ji} = (\mu) f(Y_j) g(Y_i)$, wherein $f(x)$ and $g(x)$ are predetermined odd functions of $x, \mu$ is a predetermined constant, i, j and k are nonzero positive integers and I, J and K are positive integers greater than unity.

27. A system for separating a plurality I of source signals $\{S_i\}$ in a cellular telecommunication system, each said source signal $S_i$ arriving from one of a plurality J of directions $\{D_j\}$, said system comprising:

sensor array means having a plurality K of antenna elements for receiving said plurality I of source signals $\{S_i\}$;

transducer means in each antenna element for creating a sensor output signal $E_k$ in response to said plurality I of source signals $\{S_i\}$;

beamformer means coupled to said sensor array means for creating a plurality J of spatial beam signals $\{B_j\}$ in response to said plurality K of sensor output signals $\{E_k\}$;

transform means coupled to said beamformer means for creating and storing a plurality I.J of transform signals $\{c_{ji}\}$ corresponding to an adaptive transform matrix $[C_{ji}]$;

output means coupled to said beamformer means and said transform means for generating a plurality I of output signals $\{Y_i\}$ corresponding to estimates of said source signals $\{S_i\}$ such that $[Y_i] = [II + C_{ji}]^{-1} [B_j]$, wherein [II] is the unit matrix; and adaptive transform means coupled to said output means and said transform means for adjusting each of said plurality I.J of transform signals $\{c_{ji}\}$ in response to an increment signal $\Delta c_{ji} = (\mu) f(Y_j) g(Y_i)$, wherein $f(x)$ and $g(x)$ are predetermined odd functions of $x$, $\mu$ is a predetermined constant, i, j and k are nonzero positive integers and I, J and K are positive integers greater than unity.

* * * * *

UNITED STATES PATENT AND TRADEMARK OFFICE
CERTIFICATE OF CORRECTION

PATENT NO. : 5,383,164

DATED : January 17, 1995

INVENTOR(S) : Sejnowski et al.

Page 1 of 3

It is certified that error appears in the above-indentified patent and that said Letters Patent is hereby corrected as shown below:

col 6, line 12, replace "II" with --I-- ;
      line 14, replace "$\{c_{ji}\}$" with --$\{c_{ij}\}$-- ;
      line 29, replace "II" with --I-- ; and
      line 44, replace "$j^{th}$" with --$i^{th}$-- .

col 7, line 55, replace "(7)" with --[Eqn. 7]-- .

col 8, line 4, replace "$b_m$–b" with --$b_m$=b-- ; and
      line 27, replace "$\theta_j$" with --$\theta_i$-- .

col 9, Eqn. 12, replace "$\frac{m2}{\alpha 0}$" with --$\frac{m^2}{\alpha_0}$-- ; and
      Eqn. 13, replace "$m2$" with --$m^2$-- in two locations.

col. 10, Eqn. 14, replace "m2" with --$m^2$--.

col 12, line 31, replace "$J \leq I$" with --$J \geq I$-- .

col 13, line 48, replace "(18)" with --[Eqn. 18]-- .

col 14, line 56, replace "$\{D_i\}$" with --$\{D_j\}$-- .

col 15, line 22, replace "$k2$" with --$k^2$-- ;
      line 33, replace "$k2$" with --$k^2$-- ; and
      line 37, replace "$k2$" with --$k^2$-- .

col 16, line 18, replace "$[Y_j]=[II+$" with --$[Y_i]=[I+$-- ;
      line 19, replace "II" with --I-- ; and
      line 45, replace "II" with --I-- in two locations.

UNITED STATES PATENT AND TRADEMARK OFFICE
CERTIFICATE OF CORRECTION

PATENT NO. : 5,383,164
DATED : January 17, 1995
INVENTOR(S) : Sejnowski et al.

It is certified that error appears in the above-indentified patent and that said Letters Patent is hereby corrected as shown below:

col 8, line 24, replace "$\{a_{ij}(\omega_0 0\}$" with --$\{a_{ij}(\omega_0)\}$--

UNITED STATES PATENT AND TRADEMARK OFFICE
CERTIFICATE OF CORRECTION

PATENT NO. : 5,383,164
DATED : January 17, 1995
INVENTOR(S) : Sejnowski et al.

It is certified that error appears in the above-indentified patent and that said Letters Patent is hereby corrected as shown below:

col 17, line 9, replace "$k2$" with --$k^2$-- ;
    line 20, replace "$k2$" with --$k^2$-- ;
    line 24, replace "$k2$" with --$k^2$-- ; and
    line 65, replace "$k2$" with --$k^2$-- .

col 18, line 10, replace "$k2$" with --$k^2$-- ;
    line 14, replace "$k2$" with --$k^2$-- ;
    line 42, replace "II" with --I-- ; and
    line 43, replace "II" with --I-- .

col 19, line 22, replace "1" with --I-- ;
    line 34, replace "II" with --I-- in two locations.

col 20, line 3, replace "1" with --I-- ;
    line 24, replace "II" with --I-- ;
    line 25, replace "II" with --I-- ;
    line 55, replace "II" with --I-- ; and
    line 56, replace "II" with --I-- .

Signed and Sealed this

Twenty-seventh Day of June, 1995

Attest:

BRUCE LEHMAN

*Attesting Officer*      *Commissioner of Patents and Trademarks*